United States Patent
Gislon et al.

(10) Patent No.: US 10,756,229 B2
(45) Date of Patent: Aug. 25, 2020

(54) APPARATUS FOR MANUFACTURE OF AT LEAST TWO SOLAR CELL ARRANGEMENTS, SYSTEM FOR MANUFACTURE OF AT LEAST TWO SHINGLED SOLAR CELLS, AND METHOD FOR MANUFACTURE OF AT LEAST TWO SOLAR CELL ARRANGEMENTS

(71) Applicant: APPLIED MATERIALS ITALIA S.R.L., San Biagio di Callalta (IT)

(72) Inventors: Daniele Gislon, Venice (IT); Luigi De Santi, Spresiano (IT); Thomas Micheletti, Mogliano Veneto (IT); Andrea Baccini, Mignagola Di Carbonera (IT); Mirko Galassi, Treviso (IT); Roberto Boscheratto, San Fior (IT)

(73) Assignee: APPLIED MATERIALS ITALIA S.R.L., San Biagio di Callalta (IT)

(*) Notice: Subject to any disclaimer, the term of this patent is extended or adjusted under 35 U.S.C. 154(b) by 0 days.

(21) Appl. No.: 15/326,711

(22) PCT Filed: May 6, 2016

(86) PCT No.: PCT/EP2016/060196
§ 371 (c)(1),
(2) Date: Jan. 17, 2017

(87) PCT Pub. No.: WO2017/190800
PCT Pub. Date: Nov. 9, 2017

(65) Prior Publication Data
US 2019/0058078 A1    Feb. 21, 2019

(51) Int. Cl.
*H01L 31/18* (2006.01)
*H01L 21/677* (2006.01)
(Continued)

(52) U.S. Cl.
CPC .......... *H01L 31/188* (2013.01); *B65G 15/00* (2013.01); *B65G 47/91* (2013.01); *B65G 47/92* (2013.01);
(Continued)

(58) Field of Classification Search
CPC . H01L 21/6734; H01L 21/677; H01L 31/188; B65G 47/92; Y10T 156/1062
See application file for complete search history.

(56) References Cited

U.S. PATENT DOCUMENTS 7,851,700 B2    12/2010    Luch
8,049,521 B2    11/2011    Lu et al.
(Continued)

FOREIGN PATENT DOCUMENTS

CN    103377975 A    10/2013
CN    102784760 A    7/2014
(Continued)

OTHER PUBLICATIONS

Korean Office Action dated Feb. 2018, 10-2017-700248711, 14 pages.
(Continued)

*Primary Examiner* — Mark A Osele
*Assistant Examiner* — Christopher C Caillouet
(74) *Attorney, Agent, or Firm* — Patterson + Sheridan, LLP

(57) ABSTRACT

The present disclosure provides an apparatus for manufacture of at least two solar cell arrangements. The apparatus includes a separation device configured for separating a first solar cell into two or more first solar cell solar cell pieces, and at least one positioning device configured for positioning at least one first solar cell piece of the two or more first solar cell pieces on a support device for forming a first solar cell arrangement of the at least two solar cell arrangements
(Continued)

and for positioning at least one other first solar cell piece of the two or more first solar cell pieces on the support device for forming a second solar cell arrangement of the at least two solar cell arrangements.

27 Claims, 15 Drawing Sheets

(51) Int. Cl.

| | |
|---|---|
| H01L 21/673 | (2006.01) |
| B65G 47/92 | (2006.01) |
| H01L 31/05 | (2014.01) |
| B65G 15/00 | (2006.01) |
| B65G 47/91 | (2006.01) |
| H01L 21/683 | (2006.01) |
| H02S 99/00 | (2014.01) |
| H01L 31/0224 | (2006.01) |

(52) U.S. Cl.
CPC ........ *H01L 21/677* (2013.01); *H01L 21/6734* (2013.01); *H01L 21/6833* (2013.01); *H01L 31/0504* (2013.01); *H02S 99/00* (2013.01); *H01L 31/022425* (2013.01); *Y02E 10/50* (2013.01)

(56) References Cited

U.S. PATENT DOCUMENTS

| | | | |
|---|---|---|---|
| 8,225,496 B2* | 7/2012 | Bachrach | B26F 3/002 29/33 P |
| 8,513,095 B1 | 8/2013 | Funcell et al. | |
| 2012/0061440 A1* | 3/2012 | Roell | C03B 33/033 225/2 |
| 2012/0199266 A1 | 8/2012 | Potter et al. | |
| 2013/0014802 A1 | 1/2013 | Zimmerman | |
| 2013/0136565 A1 | 5/2013 | Amsden et al. | |
| 2013/0272833 A1 | 10/2013 | Duncan et al. | |
| 2015/0090314 A1 | 4/2015 | Yang et al. | |
| 2015/0349145 A1 | 12/2015 | Morad et al. | |
| 2016/0163914 A1* | 6/2016 | Gonzalez | H01L 31/022433 156/272.8 |

FOREIGN PATENT DOCUMENTS

| | | |
|---|---|---|
| CN | 204407339 U | 6/2015 |
| EP | 1816684 A2 | 8/2007 |
| EP | 2654091 A2 | 10/2013 |
| JP | 2006-259400 A | 9/2006 |
| KR | 10-2011-0103195 | 9/2011 |
| KR | 10-1396156 B1 | 5/2014 |
| WO | 2009/129668 A1 | 10/2009 |
| WO | 2016090293 A1 | 6/2016 |
| WO | 2016090341 A1 | 6/2016 |

OTHER PUBLICATIONS

International Search Report and Written Opinion dated Jul. 8, 2016 for Application No. PCT/EP2016/060196.
Taiwan Patent Application No. 106103898, Office Action and Search Report dated Jul. 6, 2018, 9 pages.
Application No. 18171260.5, European Patent Office Search Report dated Aug. 24, 2018, 10 pages.
Chinese Patent Application No. 201680002161.1, Office Action dated Nov. 1, 2018, 13 pages.
Chinese Office Action for Application No. 201680002161.1 dated May 21, 2019, 12 pages.
European Office Action for Application No. 16720847.9-1230 dated Nov. 2, 2018, 6 pages.

* cited by examiner

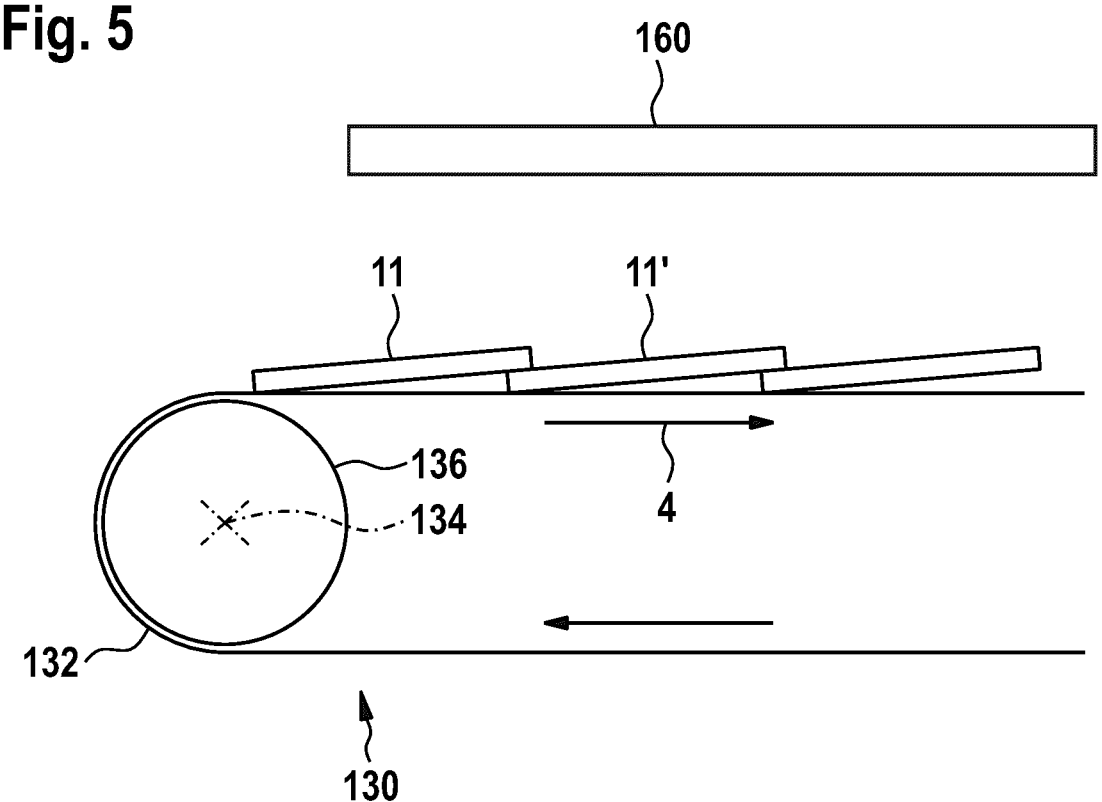

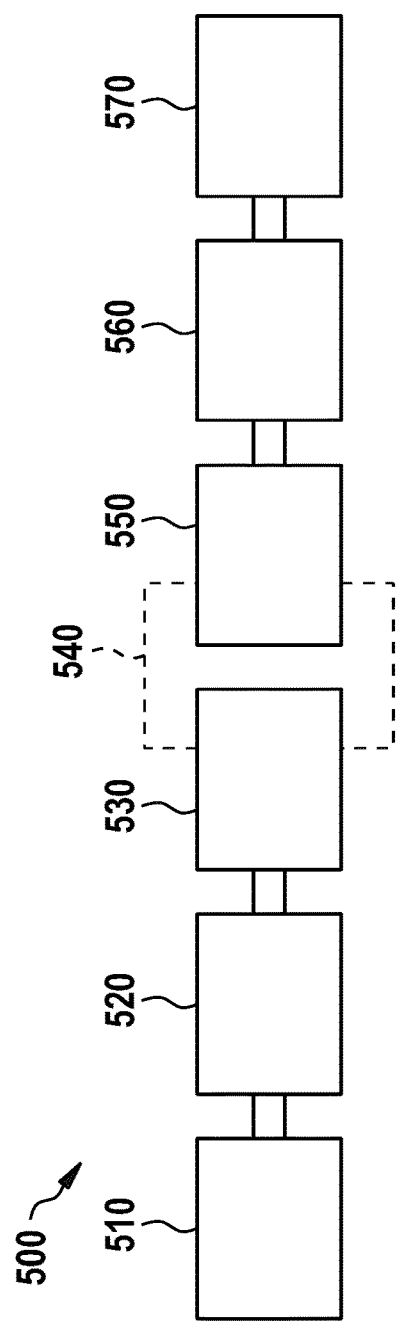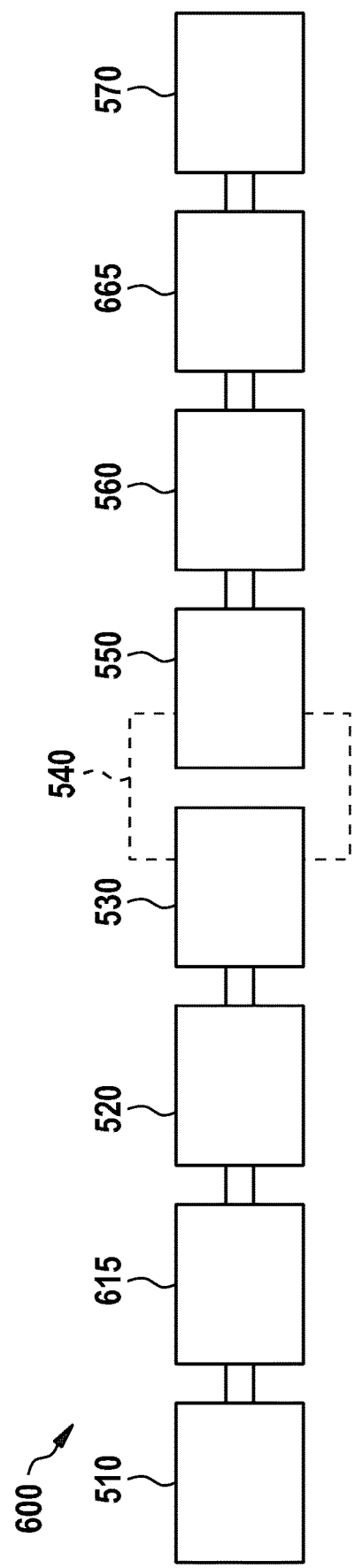

APPARATUS FOR MANUFACTURE OF AT LEAST TWO SOLAR CELL ARRANGEMENTS, SYSTEM FOR MANUFACTURE OF AT LEAST TWO SHINGLED SOLAR CELLS, AND METHOD FOR MANUFACTURE OF AT LEAST TWO SOLAR CELL ARRANGEMENTS

FIELD

Embodiments of the present disclosure relate to an apparatus for manufacture of at least two solar cell arrangements, a system for manufacture of at least two shingled solar cells, and a method for manufacture of at least two solar cell arrangements. Embodiments of the present disclosure particularly relate to an apparatus, system and method for manufacture of shingled solar cells.

BACKGROUND

Solar cells are photovoltaic devices that convert sunlight directly into electrical power. An efficiency of the solar cells can be affected by an active area on a front surface of the solar cell that is exposed to light for converting sunlight into electrical power. The active area can be reduced due to the presence of electrical contacts, such as fingers and/or busbars, on the front surface of the solar cells. The presence of the electrical contacts on the front surface of the solar cells can thus reduce a module power of a solar cell module consisting of the solar cells.

In view of the above, new apparatuses and methods for manufacture of at least two solar cell arrangements and systems for manufacture of at least two shingled solar cells, that overcome at least some of the problems in the art are beneficial. The present disclosure particularly aims at providing solar cell arrangements that have an increased efficiency and that can be easily produced. Embodiments more particularly aim at solar cell arrangements, e.g., of solar cell modules, that allow to increase a module power.

SUMMARY

In light of the above, an apparatus for manufacture of at least two solar cell arrangements, a system for manufacture of at least two shingled solar cells, and a method for manufacture of at least two solar cell arrangements are provided. Further aspects, benefits, and features of the present disclosure are apparent from the claims, the description, and the accompanying drawings.

According to an aspect of the present disclosure, an apparatus for manufacture of at least two solar cell arrangements is provided. The apparatus includes a separation device configured for separating a first solar cell into two or more first solar cell pieces, and at least one positioning device configured for positioning at least one first solar cell piece of the two or more first solar cell pieces on a support device for forming a first solar cell arrangement of the at least two solar cell arrangements and for positioning at least one other first solar cell piece of the two or more first solar cell pieces on the support device for forming a second solar cell arrangement of the at least two solar cell arrangements.

According to another aspect of the present disclosure, a system for manufacture of at least two shingled solar cells is provided. The system includes the apparatus for manufacture of at least two solar cell arrangements according to the embodiments described herein, and a production tool for manufacturing a plurality of solar cells including the first solar cell, wherein the plurality of solar cells are input into the apparatus.

According to a further aspect of the present disclosure, a method for manufacture of at least two solar cell arrangements is provided. The method includes a separating of each solar cell of one or more solar cells into two or more solar cell pieces, and a forming at least a first solar cell arrangement and a second solar cell arrangement of the at least two solar cell arrangements from the two or more solar cell pieces, wherein each solar cell piece of the two or more solar cell pieces is allocated to the first solar cell arrangement or the second solar cell arrangement based on one or more geometric and/or physical properties of the solar cell piece.

According to an aspect of the present disclosure, a support device for conveying at least one solar cell element in a transport direction is provided. The support device includes a support element configured for supporting the at least one solar cell element and an electric arrangement configured for providing an electrostatic force for holding the at least one solar cell element on the support element.

According to yet another aspect of the present disclosure, a method for conveying at least one solar cell element in a transport direction is provided. The method includes providing an electric charge to a support element configured for supporting at least one solar cell element, holding the at least one solar element by an electrostatic force, and moving the at least one solar element in the transport direction.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIG. 5 shows a schematic view of overlapping solar cell pieces on a support device according to embodiments described herein;

FIG. 9A shows a schematic view of a system for manufacture of a at least two shingled solar cells according to embodiments described herein;

FIG. 9B shows a schematic view of a system for manufacture of at least two shingled solar cells according to further embodiments described herein;

DETAILED DESCRIPTION OF EMBODIMENTS

Figure 1:
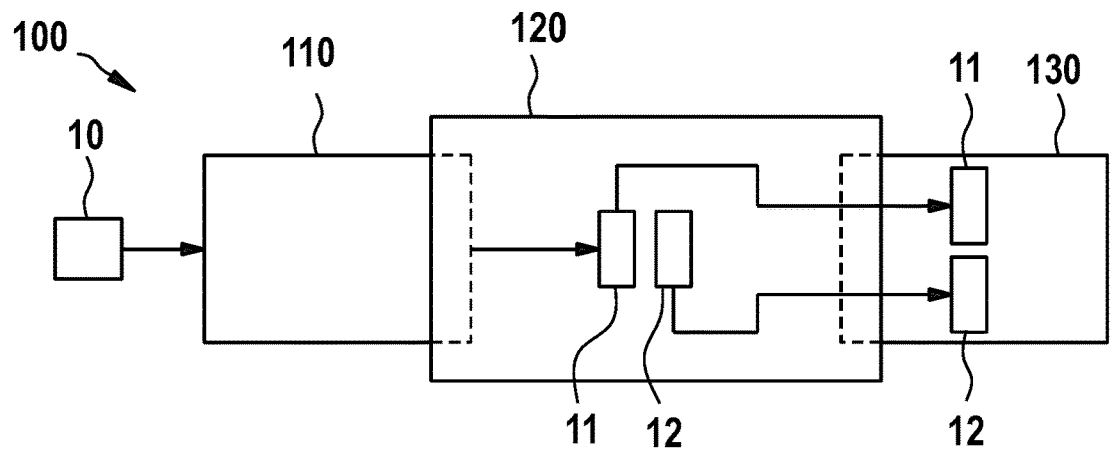
FIG. 1 shows a schematic view of an apparatus for manufacture of at least two solar cell arrangements according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The solar cell arrangements of the present disclosure can be shingled solar cells, which can also be referred to as "hypercells" or "supercells". The solar cell arrangements, can be used in solar cell modules. The solar cell arrangements can be made of a plurality of partially overlapping solar cell pieces (also referred to as "solar cell elements"). Adjacent solar cell pieces are electrically connected to each other in the overlapping region. The solar cell pieces are connected in series such that current generated by the individual solar cell pieces flows along the series of solar cell pieces to be collected, for example, at an end portion of the solar cell arrangement. The overlapping configuration can provide high-efficiency solar cell arrangements. In particular, the solar cell arrangements allow to increase a module power by increasing a used or active area. Typically, the overlapping configuration can increase the module power by, for example, 20 to 40 Watts. The used or active area can correspond to an area that is irradiated by solar light and that participates in the generation of power. As an example, the used or active area can correspond to an area of the solar cells that is not covered by, for example, conductive line patterns, such as fingers and/or busbars.

In some cases, a solar cell piece of a solar cell arrangement can have a high resistance and/or low efficiency when compared to the other solar cell pieces of the solar cell arrangement. An overall performance including, but not limited to, the module power of the solar cell arrangement and/or solar cell module can be affected or determined to a considerable extent by the solar cell piece having the high resistance and/or low efficiency. This low-quality solar cell piece particularly acts as a "bottleneck" within the solar cell arrangement.

The embodiments of the present disclosure separate, e.g., cleave a solar cell into smaller pieces, which are then sorted and allocated to at least two different solar cell arrangements. As an example, each solar cell piece can be allocated to a respective solar cell arrangement based on one or more geometric and/or physical properties of the solar cell piece. A solar cell arrangement can thus be made of solar cell elements having similar characteristics and/or quality, and an overall efficiency of the solar cell arrangement can be improved. A module power of the solar cell module having the solar cell arrangement can be increased, particularly since "bottlenecks" due to low-quality solar cell pieces can be avoided.

FIG. 1 shows a schematic view of an apparatus 100 for manufacture of at least two solar cell arrangements according to embodiments described herein. The apparatus 100 can be part of a larger production line, as it is for example described with respect to FIGS. 8 and 9.

The apparatus 100 includes a separation device 110 configured for separating a solar cell 10, such a first solar cell, into two or more first solar cell pieces, and at least one positioning device 120 configured for positioning at least one first solar cell piece 11 of the two or more first solar cell pieces on a support device 130 for forming a first solar cell arrangement of the at least two solar cell arrangements and for positioning at least one further or other first solar cell piece 12 of the two or more first solar cell pieces on the support device 130 for forming a second solar cell arrangement of the at least two solar cell arrangements. The solar cell pieces, such as the two or more first solar cell pieces, can also be referred to as "solar cell elements" or "small(er) cells".

The apparatus 100 divides the solar cell 10 into a plurality of solar cell pieces, wherein at least two solar cell pieces of said solar cell 10 are allocated to two different solar cell arrangements. As an example, the solar cell arrangements can be shingled solar cells, wherein solar cell pieces of one or more solar cells including the first solar cell can be allocated to the respective solar cell arrangement based on characteristics and/or quality of the individual solar cells and/or solar cell pieces. An efficiency of the solar cell arrangement can be improved, particularly since "bottlenecks" in the solar cell arrangement due to low-quality and/or high-resistance pieces can be avoided.

According to some embodiments, which can be combined with other embodiments described herein, the apparatus 100 further includes a centering device, such as a mechanical centering device, configured to center or align the solar cell 10 which is to be divided into the two or more solar cell pieces. As an example, the centering device can be provided at the separation device 110 to center or align the solar cell 10 with respect to the separation device 110. In particular, the solar cell 10 can be centered or aligned before the solar cell 10 is inputted into the separation device 110.

In some implementations, the solar cell 10 which is divided into the two or more solar cell pieces, such as the two more first pieces, can have one or more conductive patterns, such as fingers and/or busbars, provided thereon. In particular, the term "solar cell" can refer to a finished or nearly finished solar cell instead of, for example, an unprocessed semiconductor substrate. The solar cell 10 can have a frontside and a backside. Fingers and/or busbars can be deposited on the frontside, for example, using a printing technique such as screen printing. Optionally, the solar cell 10 can have one or more backside contacts.

According to some embodiments, which can be combined with other embodiments described herein, the at least one positioning device 120 is configured to arrange a plurality of solar cell pieces, such as a plurality of first solar cell arrangement pieces, including the at least one first solar cell piece 11 on the support device 130 with adjacent solar cell pieces partly overlapping with each other to form the first solar cell arrangement. The at least one positioning device 120 can be further configured to arrange a plurality of other solar cell pieces, such as a plurality of second solar cell arrangement pieces, including the at least one other first solar cell piece 12 on the support device 130 with adjacent solar cell pieces partly overlapping with each other to form the second solar cell arrangement. Accordingly, the hypercell can be formed by smaller cells assembled as shingles. The overlapping configuration of a solar cell arrangement is further explained with respect to FIG. 2.

According to some embodiments, the separation device 110 is configured for separating a second solar cell into two or more second solar cell pieces. The first solar cell and the second solar cell can be inputted into and/or processed by the separation device 110 sequentially or simultaneously. In particular, the separation device 110 can be configured for sequentially or simultaneously separating the first solar cell and the second solar cell into the two or more first solar cell pieces and the two or more second solar cell pieces, respectively. The positioning device 120 can be configured for positioning at least one second solar cell piece of the one or more second solar cell pieces on the support device 130 for forming the first solar cell arrangement together with the at least one first solar cell piece 11, and can be configured for positioning at least one other second solar cell piece of the two or more second solar cell pieces on the support device 130 for forming the second solar cell arrangement together with the at least one other first solar cell piece 12.

In particular, a plurality of solar cells can be divided into solar cell pieces, wherein each solar cell piece is allocated to either the first solar cell arrangement or the second solar cell arrangement. The solar cell pieces of the first solar cell arrangement can particularly include the at least one first solar cell piece 11 and the at least one second solar cell piece, and can optionally further include one or more solar cell pieces of further solar cells, such as a third, fourth, and so on solar cell. The solar cell pieces, e.g., of the second solar cell arrangement can include the at least one other first solar cell piece 12 and the at least one other second solar cell piece, and can optionally further include one or more solar cell pieces, e.g., of further solar cells, such as the third, fourth, etc solar cell.

In some implementations, the apparatus 100 is configured to allocate each solar cell piece, such as the solar cell pieces of the two or more first solar cell pieces, to either the first solar cell arrangement or the second solar cell arrangement based on one or more properties (e.g., geometric and/or physical properties) of the respective solar cell piece. As an example, each solar cell piece of the plurality of solar cells can be allocated to either the first solar cell arrangement or the second solar cell arrangement, for example, based on one or more characteristics or properties of the respective solar cell piece. The one or more characteristics or properties of the solar cell piece may be selected from the group consisting of geometric shape, electrical properties, optical properties, printing quality, and any combination thereof.

In some implementations, the at least two solar cell arrangements, such as the first solar cell arrangement and the second solar cell arrangement, can be arranged in parallel on the support device 130, for example, along a transport direction provided by the support device 130. In particular, the at least two solar cell arrangements, such as the first solar cell arrangement and the second solar cell arrangement, can be assembled simultaneously by dividing the plurality of solar cells into solar cell pieces and selectively allocating the solar cell pieces to the first solar cell arrangement and the second solar cell arrangement.

Although the example of FIG. 1 shows two solar cell arrangements on the support device 130 that are assembled in parallel, it is to be understood that the present disclosure is not limited thereto and that any number of solar cell arrangements could be assembled in parallel. As an example, the at least two solar cell arrangements can be two, three, four five, or even six solar cell arrangements, including the first solar cell arrangement and the second solar cell arrangement, that can be assembled in parallel. At least some of the solar cell arrangements can have different characteristics or quality based on the properties of the solar cell pieces which have been allocated to the individual solar cell arrangement.

According to some embodiments, which can be combined with other embodiments described herein, a solar cell arrangement, such as a shingled solar cell, can include two or more solar cell pieces.

Figure 2:
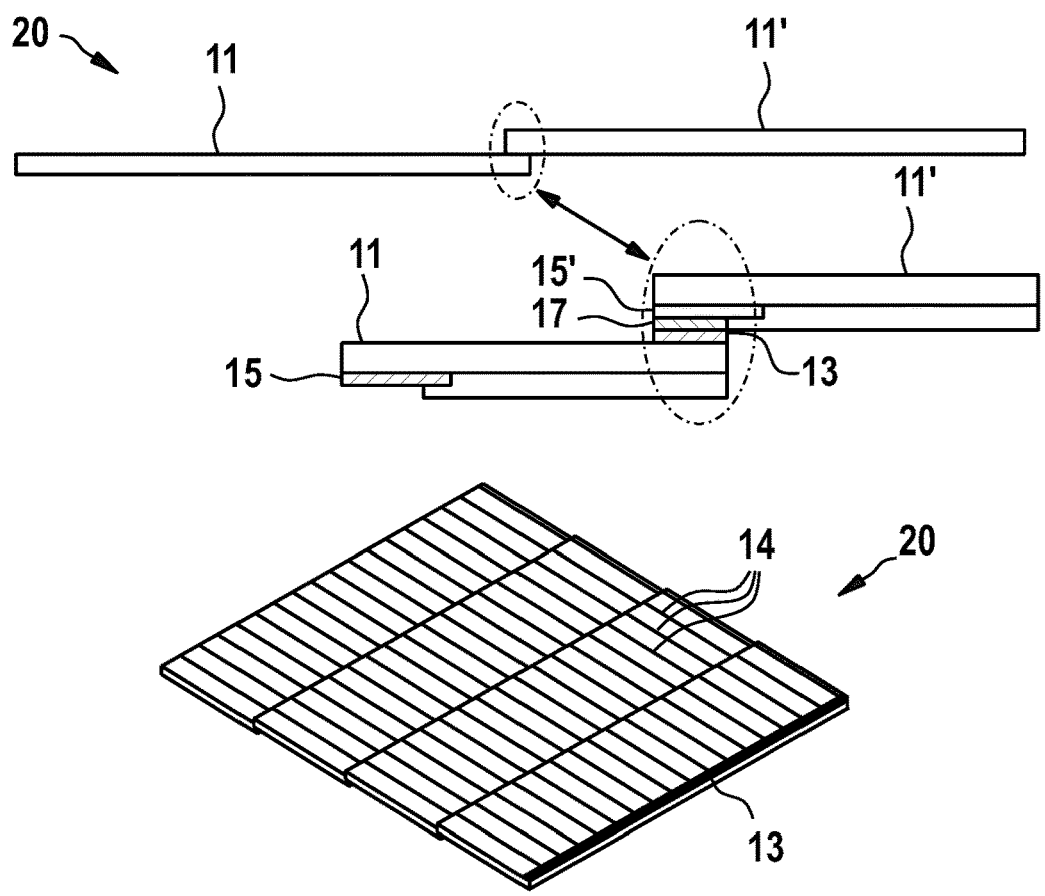
FIG. 2 shows a schematic views of a shingled solar cell manufactured using the apparatuses, systems and methods according to the embodiments described herein.

FIG. 2 shows a schematic view of a solar cell arrangement 20, which is a shingled solar cell or hypercell, and that can be manufactured using the apparatuses, systems and methods according to the embodiments described herein. The solar cell arrangement 20 can be used in a solar cell module, which is a packaged, connected assembly of a plurality of solar cells or solar cell arrangements.

The shingled solar cell includes a plurality of overlapping solar cell pieces, such as the plurality of first solar cell arrangement pieces or the plurality of second solar cell arrangement pieces described with respect to FIG. 1. As an example, the shingled solar cell can include the at least one first solar cell piece 11 of the first solar cell and the at least one second solar cell piece 11' of the second solar cell. The at least one first solar cell piece 11 and the at least one second solar cell piece 11' overlap with each other. However, the present disclosure is not limited thereto and some of the adjacent solar cell pieces of the shingled solar cell can be from the same solar cell, such as the first solar cell or the second solar cell. Adjacent solar cell pieces can overlap by less than 20%, specifically less than 10%, and more specifically less than 5% of the total surface area, such as the frontside surface or backside surface, of the solar cell pieces.

In some implementations, each solar cell piece of the plurality of overlapping solar cell pieces of the solar cell arrangement 20 can have one or more conductive patterns, such as fingers 14 and/or busbars 13, provided thereon. As an example, the solar cell piece, such as the at least one first solar cell piece 11, can have a frontside and a backside corresponding to the frontside and the backside, respectively, of the former solar cell. Optionally, the solar cell piece can have one or more backside contacts. As exemplarily shown in FIG. 2, the at least one first solar cell piece 11 can have a first backside contact 15, and the at least one second solar cell piece 11' can have a second backside contact 15'.

Adjacent solar cell pieces are electrically connected to each other in the overlapping region. The solar cell pieces are thus connected in series such that current generated by the individual solar cell pieces flows along the series of solar cell pieces to be collected, for example, at an end portion of the solar cell arrangement 20 (not shown). The overlapping configuration can provide solar cell arrangements having an increased output power. As an example, the busbar 13 provided on the at least one first solar cell piece 11 can be electrically connected to the second backside contact 15' of the at least one second solar cell piece 11'. As shown in the example of FIG. 2, the separation device can be configured to separate the solar cell adjacent to the busbars of the solar cell. In other words, each solar cell piece can have a busbar, and particularly only one busbar, provided thereon, which can be located at an edge of the solar cell piece.

In some implementations, an adhesive 17, such as an electrically conductive adhesive, can be provided to connect to solar cell pieces in the overlapping region. According to some embodiments, which can be combined with other embodiments described herein, the apparatus for manufacture of at least two solar cell arrangements includes an adhesive application device configured to apply the adhesive 17 to the solar cell or the solar cell pieces thereof, such as the two or more first pieces, before the two or more first solar cell pieces are positioned on the support device. Two solar cell pieces can be overlapped with the adhesive being provided at one solar cell piece of the two solar cell pieces such that the two solar cell pieces can be electrically and mechanically connected to each other. As an example, the adhesive can be in a substantially liquid form when the adhesive is applied to a solar cell or solar cell piece.

According to some embodiments, the adhesive application device can be configured to apply the adhesive 17 on at least a portion of the conductive line pattern, such as the busbars, of the solar cell or the solar cell pieces thereof. In some implementations, the adhesive is applied before the solar cell is divided into the two or more solar cell pieces. In other implementations, the adhesive is applied to the solar cell piece(s) after the solar cell has been divided into the two or more pieces.

According to some embodiments, the adhesive is selected from the group consisting of solder, silver paste, silicone-based electrically conductive adhesive, and epoxy-based electrically conductive adhesive.

When pieces have been overlapped, for example, in the assembling of the solar cell arrangement, a drying process can be performed to dry the adhesive. In some implementations, the drying process can include a heating of the overlapping region of the two solar cell pieces using, for example, a heater such as an infrared heater. The heater is further explained with respect to FIG. 5.

Figure 3A:
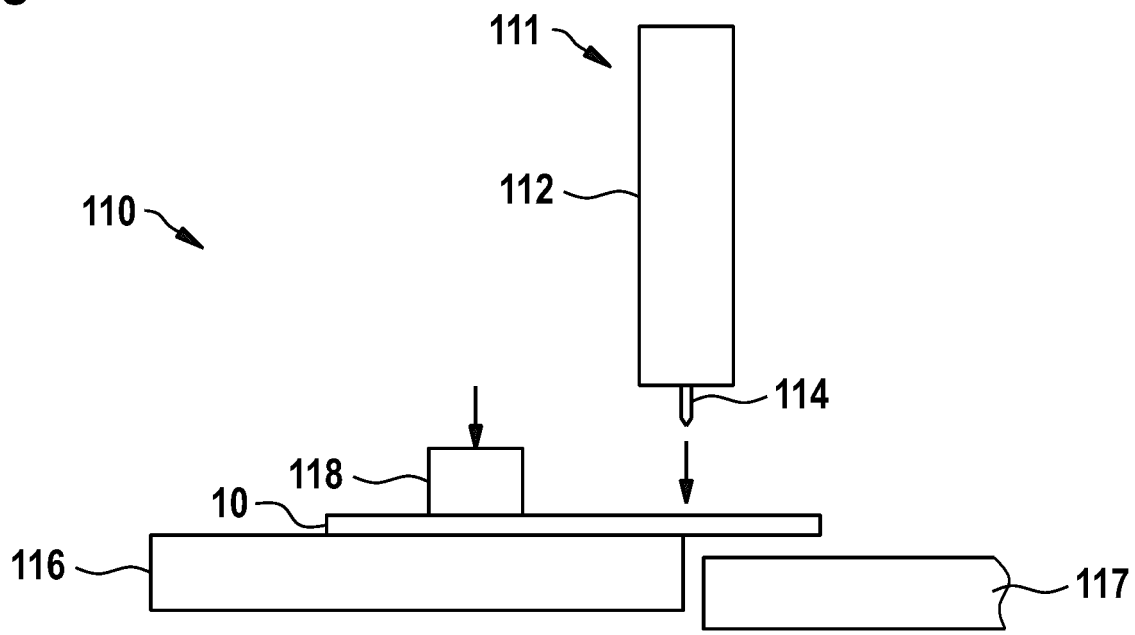
FIGS. 3A to C show schematic views of a separation device according to embodiments described herein.
Figure 3B:
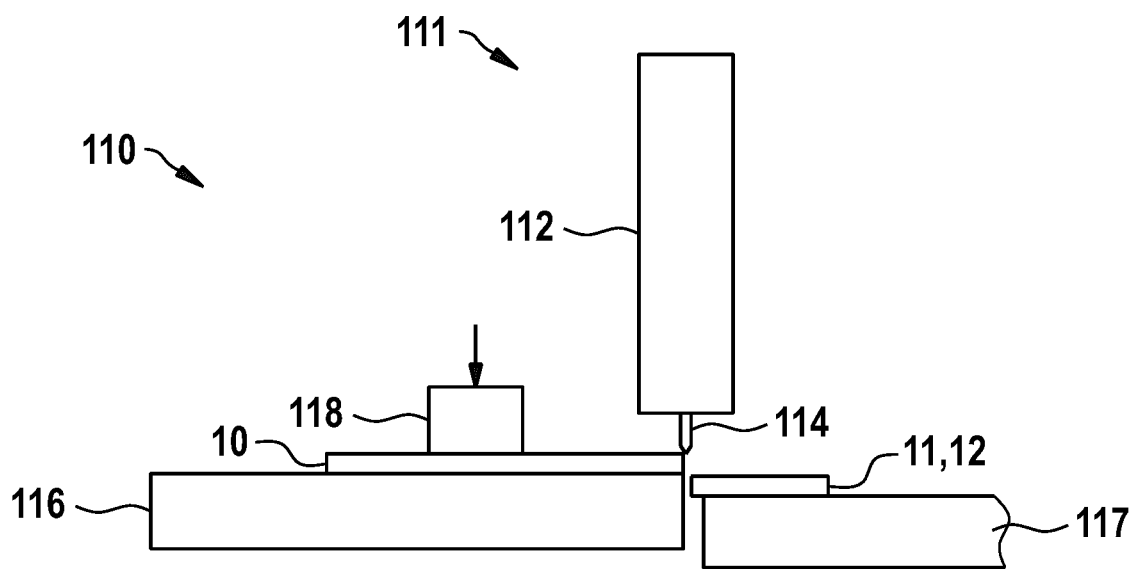
Figure 3C:
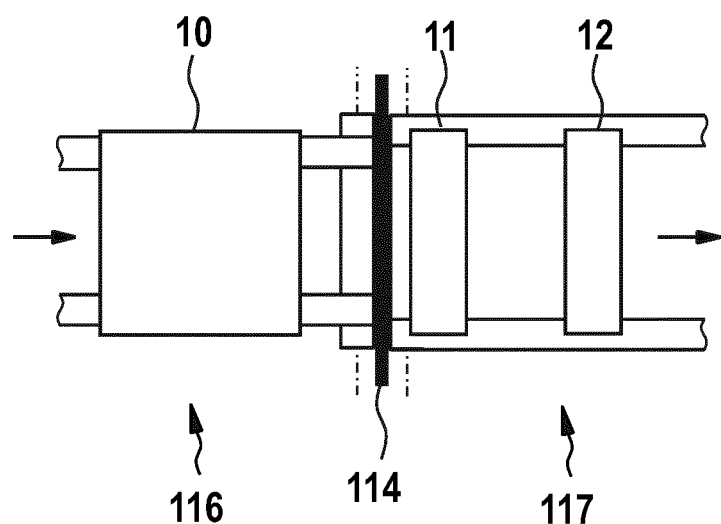

FIGS. 3A to C show schematic views of a separation device 110 according to embodiments described herein. FIGS. 3A and B show schematic side views, and FIG. 3C shows a schematic top view.

The separation device 110 is configured to separate a solar cell 10 into two or more solar cell pieces. In particular, the separation device 110 can create smaller cells (solar cell pieces or solar cell elements) starting from the (big) solar cell. According to some embodiments, which can be combined with other embodiments described herein, the separation device 110 includes, or is, a cleaving device 111 configured to mechanically contact the solar cell 10 to divide the solar cell 10. In some implementations, the cleaving device 111 includes a moveable body 112 and a contact element 114 fixed to the moveable body 112. The cleaving device 111 and the moveable body 112 can be provided as separate entities, or can be integrally formed from a single piece of material, such as a plastic material.

The contact element 114 can be a blade or an element with a sharp tip configured to contact the solar cell 10 for cleaving and dividing the solar cell 10. According to some embodiments, the contact element 114 can be made of a plastic material. In some implementations, the moveable body 112 can be configured to move the contact element 114 towards the solar cell, for example, in a quick motion, in order to provide a sharp dividing line at the solar cell 10. For instance, a motor (e.g., an up-down motor such as a linear motor) of the separation device 110 can push the moveable body 112 having the contact element 114 attached thereto against the solar cell 10 in order to cleave the solar cell 10. According to some embodiments, the moveable body 112 can be movable substantially vertically towards and away from the solar cell 10.

According to some embodiments, the separation device 110 includes a holding device 118 configured for holding the solar cell 10 at a support arrangement, such as a first support element 116 of the support arrangement, during the separation process. By fixing the solar cell 10 to the support arrangement using the holding device 118, a reliable separation process can be provided. The holding device 118 can include, or be, a holding element configured to mechanically contact the solar cell 10, such as the frontside or backside of the solar cell 10, for holding down the solar cell 10 at the support arrangement.

In some implementations, the apparatus of the present disclosure, and particularly to separation device 110, includes the support arrangement having the first support element 116 and optionally a second support element 117. The first support element 116 can be configured such that the solar cell 10 protrudes over an edge of the first support element 116 during the separation process. As an example, the cleaving device 111 can be configured to contact the solar cell 10 at a position away from the edge of the first support element 116 to break the solar cell piece off the solar cell 10, as it is exemplarily shown in FIG. 3B.

The solar cell piece that has been separated from the solar cell 10 can be collected or cached by the second support element 117, which can be offset with respect to the first support element 116, for example, in the vertical direction. As an example, the solar cell piece can fall onto the second support element 117 when the solar cell piece has been separated from the solar cell 10.

In some implementations, the first support element 116 and/or the second support element 117 can be belt conveyors configured for conveying the solar cell 10 and/or solar cell pieces, as it is shown in the top view of FIG. 3C. The first support element 116 and/or the second support element 117 can each have two or more belts spaced apart from each other. In particular, a gap can be provided between the two or more belts. In some embodiments, an inspection system can be provided, for example, below the first support element 116 and/or the second support element 117 to determine, for example, a position of the solar cell 10 and/or the solar cell pieces on the first support element 116 and/or the second support element 117. The gap between the two or more belts ensures that the inspection system, and particularly a camera thereof, can see the solar cell 10 or solar cell pieces located on the first support element 116 and/or the second support element 117.

According to some embodiments, which can be combined with other embodiments described herein, the separation device 110 includes at least one solar cell perforation device. As an example, the at least one solar cell perforation device includes, or is, a laser. As an example, the at least one solar cell perforation device can be configured to perforate the solar cell 10 before the solar cell 10 is separated into the two or more solar cell pieces by the cleaving device 111.

The at least one solar cell perforation device can be configured to generate one or more predetermined breaking points or lines on the solar cell 10 such that the solar cell 10 can be easily broke into the two or more solar cell pieces. As an example, the at least one solar cell perforation device can be configured to provide a plurality of predetermined breaking points along a substantially straight line on the solar cell that defines a separation line between two adjacent solar cell pieces. In another example, the at least one solar cell perforation device can be configured to provide a continuous predetermined breaking line on the solar cell 10 that defines the separation line between two adjacent solar cell pieces. The perforation of the solar cell 10 before the cleaving action can provide for a straight and sharp edge at the solar cell piece that is broke off the solar cell 10. In particular, for hypercell creation, the solar cell 10 can be previously lasered in order to cleave the solar cell 10 into the smaller cells in a controlled manner.

Figure 4A:
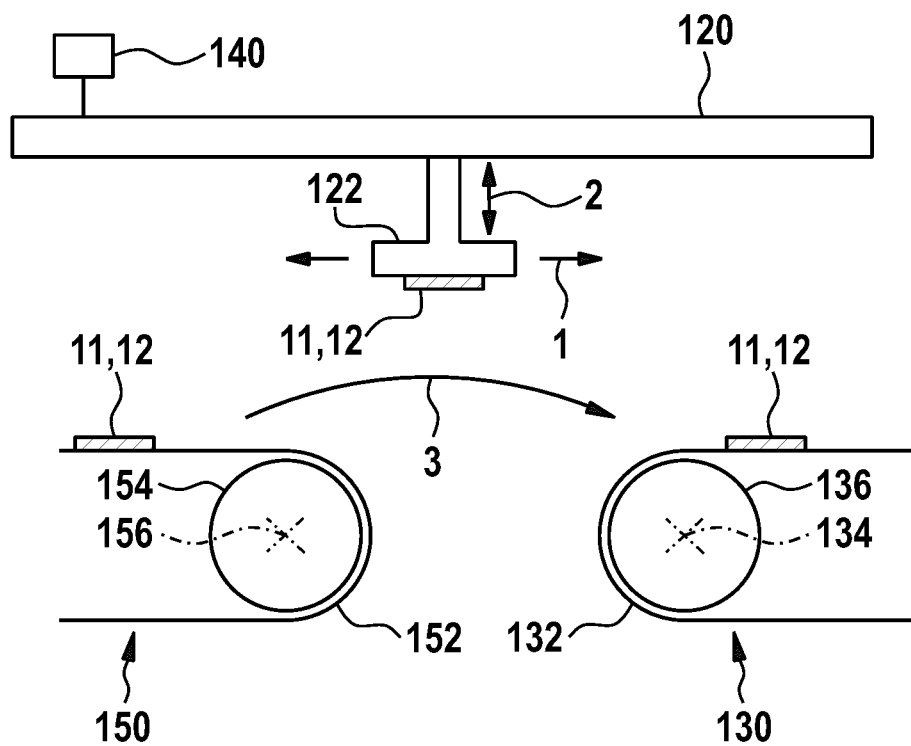
FIG. 4A shows a schematic side view of an apparatus for manufacture of at least two solar cell arrangements according to further embodiments described herein.
Figure 4B:
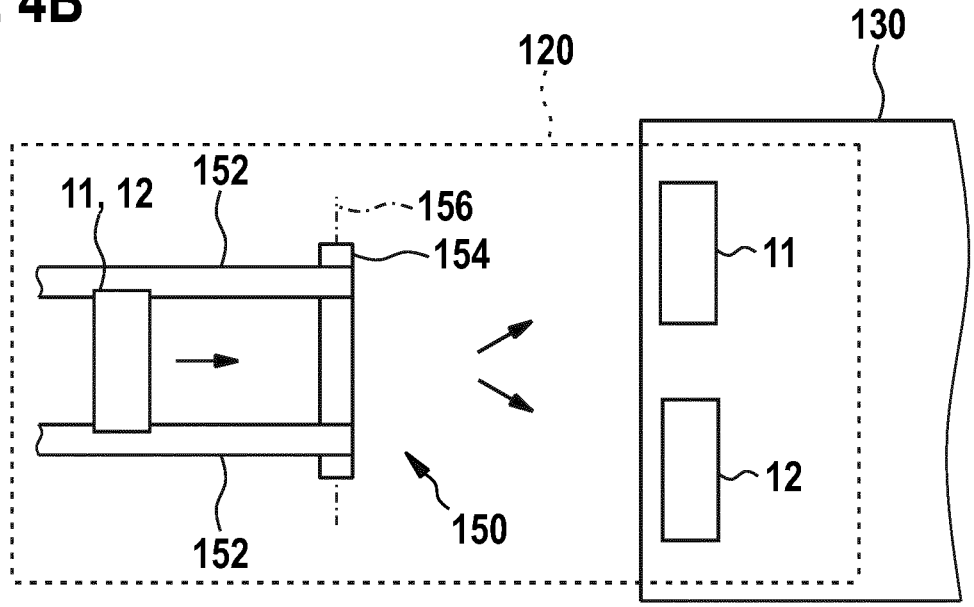
FIG. 4B shows a schematic top view of an apparatus for manufacture of at least two solar cell arrangements according to yet further embodiments described herein.

FIG. 4A shows a schematic side view of an apparatus for manufacture of at least two solar cell arrangements according to further embodiments described herein. FIG. 4B shows a schematic top view of the apparatus. FIG. 5 shows a schematic view of overlapping solar cell pieces on a support device 130 according to embodiments described herein.

According to some embodiments, which can be combined with other embodiments described herein, the apparatus includes a transport device 150 configured for transportation of the solar cell pieces of the solar cell(s), such as the two or more first solar cell pieces of the first solar cell. The transport device 150 can include, or be, a belt conveyor having a roller 154 rotatable around a first rotational axis 156 and one or more first belts 152 provided on the roller 154. In some implementations, the transport device 150 can have two or more belts arranged in parallel and with gaps provided between the two or more belts.

In some implementations, the first support element and/or the second support element of the support arrangement of the separation device described with respect to FIGS. 3A to C can be provided by the transport device 150, and particularly by the one or more first belts 152. The separation device is not illustrated in FIGS. 4A and B.

According to some embodiments, the support device 130 of the apparatus for manufacture of at least two solar cell arrangements according to the embodiments described herein can include, or be, a belt conveyor. The support device 130, e.g., the belt conveyor, is configured to support, fix and transport the at least two solar cell arrangements, such as the first solar cell arrangement and the second solar cell arrangement. In particular, the support device 130 can be configured for transportation of the at least two solar cell arrangements in a transport direction 4, which can be a substantially horizontal direction (for example, see FIG. 5).

The belt conveyor constituting the support device 130 can include a roller 136 rotatable around a second rotational axis 134 and one or more second belts 132 provided on the roller 136. In some implementations, the support device 130 can have two or more belts arranged in parallel and with gaps provided between the two or more belts. As an example, each belt of the two or more belts can be configured to support (only) one solar cell arrangement of the at least two solar cell arrangements (for example, see FIG. 8A). In other implementations, the support device 130 has one single belt on which the at least two solar cell arrangements can be assembled in parallel (for example, see FIG. 8B).

According to some embodiments, which can be combined with other embodiments described herein, the support device 130 includes, or is, at least one of an electrostatic chuck and a vacuum chuck. The electrostatic chuck that can be used as the support device is further described with respect to FIGS. 11 to 17. The vacuum chuck can include a support surface configured to support the at least two solar cell arrangements, wherein the support surface can have at least one of holes and recesses connected to a suction device, such as a vacuum pump, in order to generate an under pressure in the holes and/or recesses to hold the solar cell arrangement at the support surface.

The at least one positioning device 120 is configured for moving or transferring the solar cell pieces of the solar cell from, for example, the transport device 150 to the support device 130 (indicated with reference numeral 3). As an example, the positioning device 120 can sequentially grip or pick up the solar cell pieces from the transport device 150, move the solar cell pieces to the support device 130, optionally align the solar cell pieces, and release the solar cell pieces in a predetermined position. In particular, the positioning device 120 can be configured to arrange the solar cell pieces in an overlapping manner to form the first solar cell arrangement and the second solar cell arrangement. While the at least two solar cell arrangements are assembled on the support device 130, the support device 130, and particularly the one or more first belts having the (partially) assembled solar cell arrangements positioned thereon, can continuously move in the transport direction 4. A continuous manufacturing process can be provided.

According to some embodiments, the apparatus includes a controller 140 configured to control the at least one positioning device 120. In particular, the controller 140 can control a movement of the positioning device 120 to move a solar cell piece to assemble a solar cell arrangement to which the solar cell piece has been allocated. As an example, the controller 140 can control the at least one positioning device 120 to move the solar cell piece to either the first solar cell arrangement or the second solar cell arrangement based on one or more properties (e.g., geometric and/or physical properties) of the piece, such as geometric shape, electrical properties, optical properties, printing quality, and any combination thereof.

According to some embodiments, which can be combined with other embodiments described herein, the at least one positioning device 120 includes a gripper 122 configured to grip and hold a solar cell piece, such as the two more first pieces of the first solar cell. The gripper 122 can be selected from the group consisting of vacuum grippers, mechanical grippers, electrostatic grippers, electrodynamic grippers, and any combination thereof. Embodiments of the gripper 122 are further explained with respect to FIGS. 6A and B.

In some implementations, the positioning device 120 is movable in at least one of a first direction 1 and a second direction 2. The first direction 1 can be a substantially horizontal direction. The second direction 2 can be a substantially vertical direction. The positioning device 120 can be movable sequentially or simultaneously in at least one of the first direction 1 and the second direction 2. By the movement in the first direction 1 and the second direction 2, the solar cell piece held by the positioning device 120 can be moved to the support device 130 for assembling of a solar cell arrangement, such as the first solar cell arrangement and/or the second solar cell arrangement.

As an example, the positioning device 120 can move in the second direction 2, for example, upwards, to pick up the solar cell piece from the transport device 150. The positioning device 120 can then move in the first direction 1, for example, forwards, to move the solar cell piece from the transport device 150 to the support device 130. The positioning device 120 can move in the second direction 2, for example, downwards, to place the solar cell piece on the support device 130. The positioning device 120 can then move in the second direction 2 and the first direction 1, for example, back to the transport device 150 to pick up another solar cell piece from the transport device 150. It is to be understood that the movement in the first direction 1 can be a movement in a forward direction and a backward direction. Likewise, the movement in the second direction 2 can be a movement in an upward direction and a movement in a downward direction.

The term "vertical direction" is understood to distinguish over "horizontal direction". That is, the "vertical direction" relates to a substantially vertical movement, wherein a deviation of a few degrees, e.g. up to 5° or even up to 10°, from an exact vertical direction is still considered as a "substantially vertical direction". The vertical direction can be substantially parallel to the force of gravity.

In some implementations, the apparatus, and particularly the positioning device 120, can be configured for alignment of the solar cell piece held by the positioning device 120 before the solar cell piece is put on the support device 130. The apparatus can use information acquired by an inspection system which can include, for example, a camera configured to detect a position and/or orientation of the solar cell piece, for example, held by the positioning device 120.

In some implementations, the positioning device 120 is movable a plane, such as a substantially horizontal plane. Such a movement can also be referred to as "Θ movement". As an example, the positioning device 120 can be configured to adjust or align an angular orientation of a solar cell piece held by the positioning device 120 in the plane. The angular orientation of the solar cell piece can be aligned, for example, with respect to the support device 130 and/or another solar cell piece on the support device 130 with which the solar cell piece held by the positioning device 120 is to be overlapped. The solar cell arrangement can be accurately assembled, wherein a quality of the solar cell arrangement can be improved. In some implementations, the positioning device 120 can be configured to rotate the solar cell piece around a substantially vertical rotational axis by about 180°. In particular, edge pieces of pseudo-square solar cells described with respect to FIG. 7B can be brought into similar orientations. As an example, one edge piece (e.g., the front or leading edge piece) of the pseudo-square solar cell is not rotated by about 180° and the other edge piece (e.g., the back or trailing edge piece) of the pseudo-square solar cell is rotated by about 180° such that the geometric shapes of the edge pieces are equally oriented or aligned.

According to some embodiments, the positioning device 120 is tiltable, for example, with respect to the first direction 1 and/or a horizontal plane. As an example, the positioning device 120 can tilt the solar cell piece held by the positioning device 120 to align an orientation of the solar cell piece with respect to another solar cell piece on the support device 130 with which the solar cell piece held by the positioning device 120 is to be overlapped. In particular, the backside or backside plane of the solar cell piece held by the positioning device 120 can be oriented to be substantially parallel to a frontside or frontside plane of the other solar cell piece on the support device 130. In some implementations, the positioning device 120 is configured to align a backside contact of the solar cell piece with respect to a frontside contact, such as a busbar, of another solar cell piece on the support device 130 such that an electrical contact between the backside contact and the frontside contact can be established, for example, with an adhesive provided therebetween.

As shown in FIG. 5, a plurality of solar cell pieces can be positioned on the support device 130 in an overlapping manner to form the solar cell arrangement, which can be a shingled solar cell. At least some of the plurality of pieces originate from at least two different solar cells. In particular, the solar cell pieces can be sorted and individually be allocated to a respective solar cell arrangement, for example, based on one or more properties, such as geometric and/or physical properties, of the respective solar cell piece.

In some implementations, the support device 130 is a belt conveyor having the one or more second belts 132. A movement of the belt conveyor, and in particular of the one or more second belts 132, and a movement of the at least one positioning device 120 can be synchronized with each other, for example, during the assembling of the at least two solar cell arrangements on the support device 130. Additionally or alternatively, a movement of the transport device 150, for example, the one or more first belts 152, and a movement of the at least one positioning device 120 and/or the one or more second belts 132 can be synchronized with each other. By synchronizing at least some of the movements, a continuous process flow for assembling of the at least two solar cell arrangements can be provided.

According to some embodiments, which can be combined with other embodiments described herein, the apparatus further includes a heating device 160, for example, at or above the support device 130. The heating device 160 is configured to heat at least one of the solar cell arrangements on the support device 130, such as the first solar cell arrangement and/or the second solar cell arrangement. The heating device 160 can be selected from the group consisting of conduction heaters (e.g., hot plates), convective heaters, resistive heaters, infrared heaters, lamp heaters, hot air heaters, and any combination thereof. As an example, the support device 130 can be configured as a hot plate for conduction heat transfer to heat the solar cell arrangement(s) on the support device 130.

In some implementations, the heating device 160 can extend along at least a portion of the support device 130, for example, in the transport direction 4 in which the solar cell arrangements are conveyed by the support device 130. The heating device 160 can extend along a distance sufficient to dry the adhesive used for electrically connecting adjacent overlapping solar cell pieces, such as the silver paste or solder. The heating device 160 can have two or more heating elements provided in parallel at the support device 130. As an example, a first heating element can be configured to heat the first solar cell arrangement. A second heating element can be configured to heat the second solar cell arrangement. In particular, according to some embodiments, the heating device 160 can extend above the support device 130 at positions corresponding to positions of the at least two solar cell arrangements. As an example, the first heating element can be arranged above the first solar cell arrangement, and the second heating element can be arranged above the second solar cell arrangement.

The heating device 160 can be configured to provide a predetermined temperature at the position of at least a portion of the solar cell arrangement. The predetermined temperature can be at least 100° C., specifically at least 150° C., and more specifically at least 300° C. The predetermined temperature can be in a range of between 100° C. and 400° C., and can be specifically in a range of between 100° C. and 200° C.

Figure 6A:
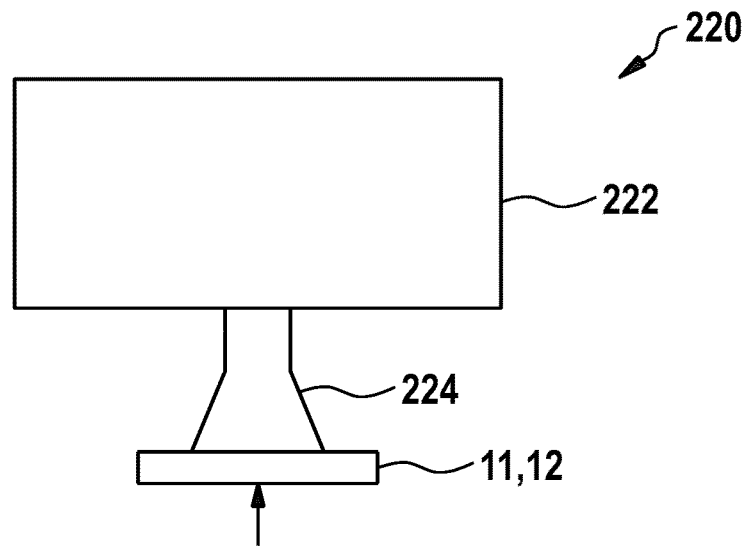
FIGS. 6A and B show schematic views of a positioning device according to embodiments described herein.

FIGS. 6A and B show schematic views of a positioning device 220 according to embodiments described herein.

According to some embodiments, which can be combined with other embodiments described herein, the at least one positioning device 220 includes one or more grippers 222 configured to grip and hold a solar cell piece, such as the two more first pieces of the first solar cell. The one or more grippers 222 can be selected from the group consisting of vacuum grippers, mechanical grippers, electrostatic grippers, electrodynamic grippers, and any combination thereof. The vacuum can use a suction force to hold the solar cell piece at the gripper. The mechanical gripper can use mechanical devices, such as clamps, to hold the solar cell piece at the gripper. The electrostatic grippers and electrodynamic grippers can use an electrostatic force and an electrodynamic force, respectively, to hold the solar cell piece at the gripper.

In some implementations, at least one gripper, and particularly each gripper, of the one or more grippers 222 can include one or more gripper elements 224. As an example, the gripper can include two or more, such as three, four, five or six gripper elements 224 configured for contacting and gripping a solar cell piece. As an example, the one or more gripper elements 224 can be suction cups configured to provide an under-pressure at a surface of the solar cell piece to hold the piece that the one or more gripper elements 224.

According to some embodiments, each gripper of the one or more grippers 222 is configured for holding and moving one solar cell piece. In further embodiments, each gripper of the one or more grippers 222 is configured for simultaneously holding and moving two or more solar cell pieces.

Figure 7A:
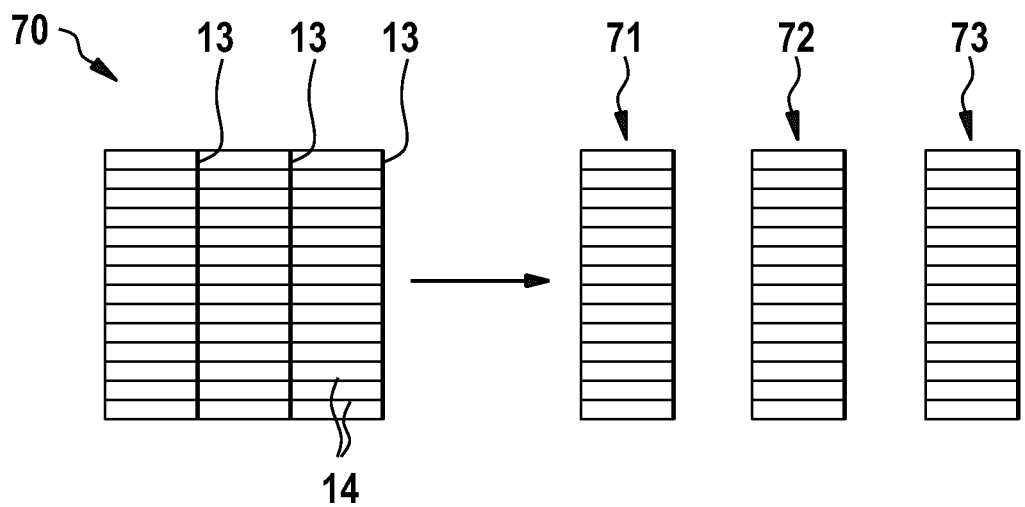
FIGS. 7A and B show schematic views of a full-square solar cell and a pseudo-square solar cell, respectively, according to embodiments described herein.
Figure 7B:
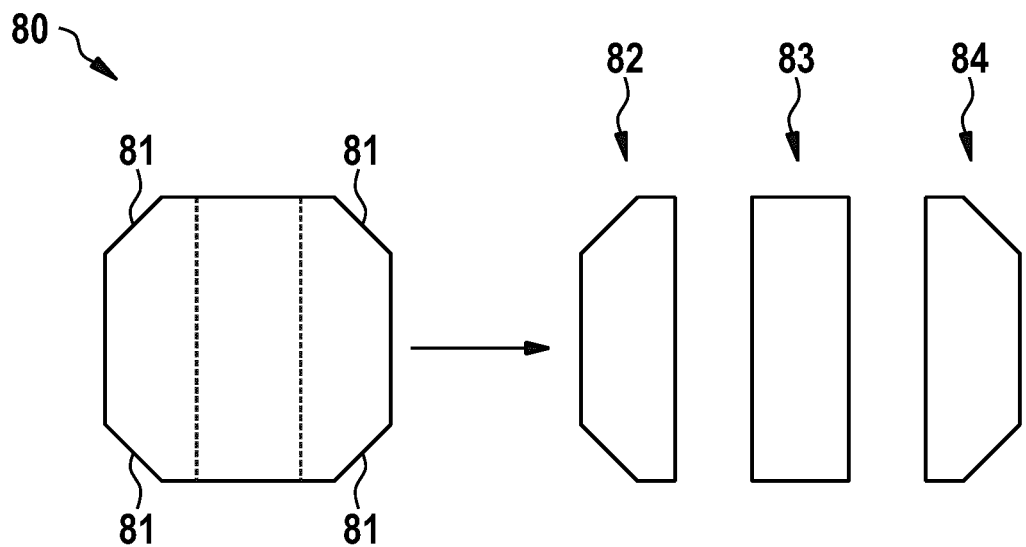

FIGS. 7A and B show schematic views of a full-square solar cell 70 and a pseudo-square solar cell 80, respectively, according to embodiments described herein.

The full-square solar cell 70 can be, for example, a quadratic multi crystalline wafer cut from silicon ingots. The full-square solar cell 70 having fingers 14 and busbars 13 provided thereon can be cleaved into a plurality of pieces, such as the three pieces 71, 72, and 73 which are exemplarily illustrated in FIG. 7A.

The pseudo-square solar cell 80 can be a squared wafer with rounded edges 81 cut from monocrystalline silicon ingots. In comparison with the full-square solar cell 70, the pseudo-square solar cell 80 can be beneficial in that less waste is produced during the manufacturing process. The pseudo-square solar cell 80 can be cleaved into a plurality of pieces, such as the three pieces 82, 83, and 84 exemplarily illustrated in FIG. 7B.

The individual pieces of the solar cells can be allocated to different solar cell arrangements based on the geometric shape. As an example, the (edge) pieces of the pseudo-square solar cell 80 having the rounded edges 81 ("pseudo-square pieces") can be allocated to one solar cell arrangement, for example, the first solar cell arrangement. The (middle) piece(s), which are full-square pieces, can be allocated to another solar cell arrangement, for example, the second solar cell arrangement. Specifically, solar cell arrangements having only full-square pieces or only pseud-square pieces are provided. "Bottlenecks" caused by a pseud-square piece in a solar cell arrangement having otherwise full-square pieces can be avoided and an efficiency of the solar cell arrangement can be increased. Particular, module power can be increased. According to some implementations, and as described with respect to FIGS. 4A, 4B and 5, either the solar cell piece 82 or the solar cell piece 84 can be rotated by about 180° such that both solar cell pieces, and particularly the rounded edges 81 thereof, are equally aligned before the solar cell arrangement is assembled.

According to some embodiments, which can be combined with other embodiments described herein, the solar cells, such as the full-square solar cell 70 and/or pseudo-square solar cell 80, can be separated or divided at positions adjacent to the busbars 13 of the respective solar cell. In other words, each solar cell piece can have a busbar, and particularly only one busbar, provided thereon, which can be located at an edge of the solar cell piece.

Figure 8A:
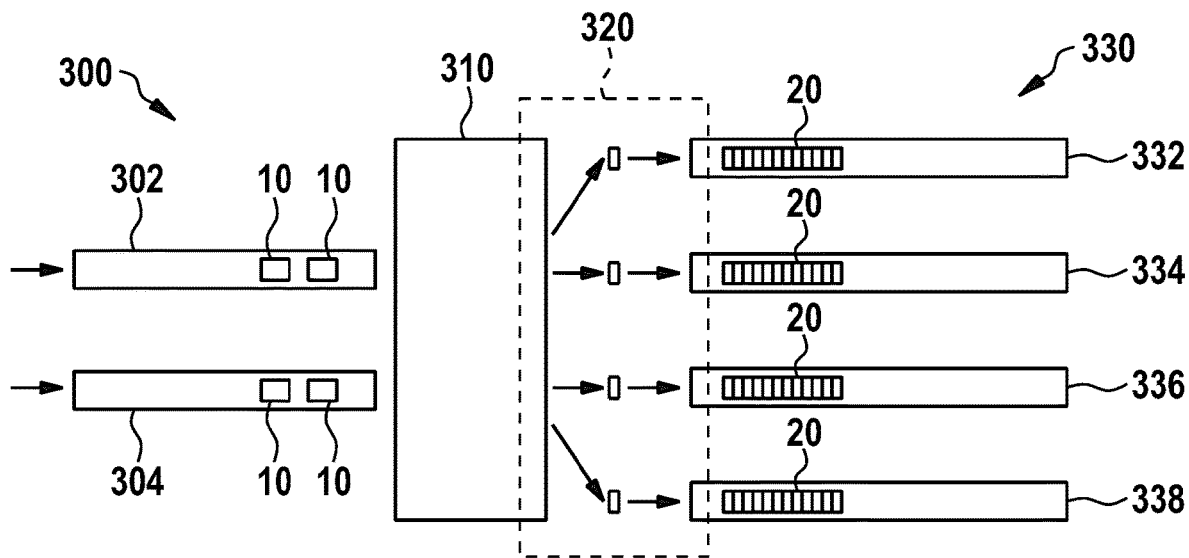
FIG. 8A shows a schematic view of an apparatus for manufacture of at least two solar cell arrangements according to embodiments described herein.

FIG. 8A shows a schematic view of an apparatus 300 for manufacture of at least two solar cell arrangements, such as shingled solar cells, according to an embodiment described herein.

According to some embodiments, which can be combined with other embodiments described herein, the apparatus 300 can include one or more input conveyors, such as a first input conveyor 302 and a second input conveyor 304, configured for inputting solar cells into the separation device 310. The one or more input conveyors can be parallel lanes for simultaneously inputting a plurality of solar cells into the separation device 310. The one or more input conveyors can be belt conveyors. According to some embodiments, the transport device described with respect to FIGS. 4A, 4B and 5 can be provided by the one or more input conveyors.

According to some embodiments, the apparatus 300 further includes one or more centering devices, such as one or more mechanical centering devices, configured to center or align the solar cells 10 which are to be processed by the separation device 310. As an example, each input conveyor of the one or more input conveyors can have a respective centering device. In particular, a first centering device can be provided at the first input conveyor 302 and a second centering device can be provided at the second input conveyor 304.

In some implementations, the separation device 310 is configured for separating a plurality of solar cells into solar cell pieces. An example, the separation device 310 is configured for separating at least the first solar cell into the two or more first solar cell pieces and the second solar cell into the two or more second solar cell pieces. As an example, the separation device 310 is configured for sequentially or simultaneously separating the first solar cell and the second solar cell into the two or more first solar cell pieces and the two or more second solar cell pieces, respectively.

In one example, the first solar cell and the second solar cell can be sequentially inputted into the separation device 310 using, for example, the first input conveyor 302 or the second input conveyor 304. The separation device 310 can sequentially separate the first solar cell and the second solar cell into the two or more first solar cell pieces and the two or more second solar cell pieces, respectively. Each piece is then allocated to a respective solar cell arrangement, for example, based on one or more properties, such as geometric and/or physical properties, of the solar cell piece.

In another example, the first solar cell and the second solar cell can be simultaneously inputted into the separation device 310 using, for example, the first input conveyor 302 and the second input conveyor 304. In particular, the first solar cell can be inputted using the first input conveyor 302 and the second solar cell can be inputted using the second input conveyor 304. The separation device 310 can substantially simultaneously separate the first solar cell and the second solar cell into the two or more first solar cell pieces and the two or more second solar cell pieces, respectively. In other words, two or more solar cells, such as the first solar cell and the second solar cell, can be simultaneously inputted into, and cleaved by, the separation device 310 for parallel production of a plurality of solar cell pieces from two or more solar cells. Each solar cell piece is then allocated to a respective solar cell arrangement, for example, based on one or more properties of the solar cell piece.

Although two input conveyors are illustrated in the example of FIG. 8A, it is to be understood that the present disclosure is not limited thereto and that one input conveyor or three, four or even more input conveyors can be provided for (simultaneously) inputting a plurality of solar cells into the separation device 310.

According to some embodiments, the separation device 310 includes at least a first cleaving device configured for separating the first solar cell into the two or more first solar cell pieces and a second cleaving device configured for separating the second solar cell into the two or more second solar cell pieces. Specifically, the separation device 310 can include two or more cleaving devices, such as the first cleaving device and the second cleaving device, for a simultaneous or parallel processing of two or more solar cells. Providing the parallel arrangement of the first cleaving device and the second cleaving device can be particularly beneficial when two or more solar cells are simultaneously inputted into the separation device 310.

The positioning device 320 is configured for positioning the solar cell pieces provided by the separation device 310 on the support device 330 for the parallel assembling of the at least two solar cell arrangements. In some implementations, the positioning device 320 is configured for positioning at least one second solar cell piece of the one or more second solar cell pieces of the second solar cell on the support device 330 for forming the first solar cell arrangement together with the at least one first solar cell piece of the first solar cell, and is configured for positioning at least one other second solar cell piece of the two or more second solar cell pieces of the second solar cell on the support device 330 for forming the second solar cell arrangement together with the at least one other first solar cell piece.

As an example, solar cell pieces of the solar cells sequentially or simultaneously processed by the separation device 310 and having a first predetermined property, such as a first predetermined geometric shape, can be arranged to form one solar cell arrangement, for example, the first solar cell arrangement. Solar cell pieces of solar cells sequentially or simultaneously processed by the separation device 310 and having a second predetermined property, such as a second predetermined geometric shape, can be arranged to form another solar cell arrangement, for example, the second solar cell arrangement. For instance, the (edge) pieces of the pseudo-square solar cell having the rounded edges ("pseudo-square pieces") can have the first predetermined geometric shape. The (middle) piece(s), which are full-square pieces, can have the second predetermined geometric shape. Accordingly, solar cell arrangements having either only pseudo-square pieces or only full-square pieces can be assembled. Full-square pieces can originate from both, pseudo-square solar cells and full-square solar cells.

According to some embodiments, which can be combined with other embodiments described herein, the support device 330 can have two or more support units arranged in parallel. The two or more support units can be separated from each other. Each support unit of the two or more support units can be configured to support a respective solar cell arrangement of the at least two solar cell arrangements. As an example, a first support unit 332 can be configured to support the first solar cell arrangement and a second support unit 334 can be configured to support the second solar cell arrangement. The support device 330 can include further support units, such as a third support unit 336 and the fourth support unit 338 configured to support further solar cell arrangements.

As an example, solar cell pieces of solar cells inputted via the first input conveyor 302 can be allocated to solar cell arrangements on the first support unit 332 and the second support unit 334. Solar cell pieces of solar cells inputted via the second input conveyor 304 can be allocated to solar cell arrangements on the third support unit 336 and the fourth support unit 338. In this example, the first support unit 332 and the second support unit 334 can be operated independently from the third support unit 336 and the fourth support unit 338. Likewise, the first input conveyor 302 and the cleaving procedure of the solar cells inputted via the first input conveyor 302 can be operated independently from the second input conveyor 304 and the cleaving procedure of the solar cells inputted via the second input conveyor 304. A throughput of the apparatus 300 can be increased, since malfunctions have a localized effect and do not lead to a stop of the whole production process.

In further examples, solar cell pieces of solar cells inputted via the first input conveyor 302 can be allocated to solar cell arrangements on any one of the two or more support units, such as the first to fourth support units. Likewise, solar cell pieces of solar cells inputted via the second input conveyor 304 can be allocated to solar cell arrangements on any one of the two or more support units, such as the first to fourth support units.

According to some embodiments, the support device 330 includes the at least a belt conveyor, wherein the at least a belt conveyor includes two or more belt conveyor spaced apart from each other. As an example, a first belt conveyor is configured to support the first solar cell arrangement and a second belt conveyor spaced apart from the first belt conveyor is configured to support the second solar cell arrangement. In some implementations, the two or more support units are belt conveyors arranged in parallel. As an example, the first support unit 332 is the first belt conveyor, the second support unit 334 is the second belt conveyor, the third support unit 336 is a third belt conveyor, and the fourth support unit 338 is a fourth belt conveyor. The first to fourth belt conveyors can be arranged in parallel.

In some implementations, a movement of the support device 330 provided by the belt conveyor and a movement of the at least one positioning device 320 are synchronized or correlated with each other. As an example, a movement of the first input conveyor 302, a cleaving process of the solar cells inputted via the first input conveyor 302, an operation of the positioning device 320, and a movement of the first support unit 332 and the second support unit 334 are synchronized or coordinated. Likewise, a movement of the second input conveyor 304, a cleaving process of the solar cells inputted via the second input conveyor 304, an operation of the positioning device 320, and a movement of the third support unit 336 and the fourth support unit 338 are synchronized or coordinated.

According to some embodiments, which can be combined with other embodiments described herein, the apparatus 300 is configured to allocate each solar cell piece of the solar cells to a respective solar cell arrangement based on one or more properties, such as geometric and/or physical properties, of the solar cell piece. As an example, the apparatus 300 is configured to allocate each solar cell piece of the two or more first for pieces of the first solar cell to either the first solar cell arrangement or the second solar cell arrangement based on one or more properties of the respective solar cell piece of the two more first solar cell pieces. Likewise, the apparatus 300 can be configured to allocate each solar cell piece of the two or more second solar cell pieces of the second solar cell to either the first solar cell arrangement or the second solar cell arrangement based on one or more properties of the respective solar cell piece of the two more second solar cell pieces.

The one or more properties can be determined before the solar cell is cleaved into the solar cell pieces and/or after the solar cell has been cleaved into the solar cell pieces. In the former case, measurements, such as electrical measurements, of the whole solar cell can be performed. In the latter case, measurements, such as electroluminescence and/or photoluminescence measurements, of the individual solar cell pieces can be performed.

The one or more properties can be based on metrology. As an example, the one or more properties, such as the one or more geometric and/or physical properties, can be selected from the group consisting of geometric shape, electrical properties, optical properties, printing quality, and any combination thereof. The geometric shape can be, for example, "pseudo-square" and/or "full square", as explained with respect to FIGS. 7A and B. As an example, the (edge) pieces of a pseudo-square solar cell having the rounded edges ("pseudo-square pieces") can be allocated to one solar cell arrangement, for example, the first solar cell arrangement. The (middle) piece(s), which are full-square pieces, can be allocated to another solar cell arrangement, for example, the second solar cell arrangement.

The electrical properties, optical properties or combined electrical and optical properties can be selected from the group consisting of electroluminescence, photoluminescence, and electrical characteristics. As an example, at least one of electroluminescence measurements, photoluminescence measurements, and electrical measurements (e.g., measurements of a current-voltage (I-V) curve of the solar cell) can be performed before the solar cell is cleaved into the solar cell pieces. Additionally or alternatively, at least one of electroluminescence measurements and photoluminescence measurements can be performed for each solar cell piece after the solar cell has been cleaved into said solar cell pieces.

Additionally or alternatively to the above electrical properties, optical properties or combined electrical and optical properties, at least one of a printing quality and structural integrity of the solar cell and/or the solar cell pieces can be performed. As an example, a printing quality and/or structural integrity can be determined before the solar cell is cleaved into the solar cell pieces. Additionally or alternatively, printing quality and/or structural integrity can be determined for each solar cell piece after the solar cell has been cleaved into said solar cell pieces. The determining of the printing quality may include a determining of a quality (e.g., accuracy, line thickness, lined width, and like) of a conductive line pattern of the solar cell, for example, of fingers and/or busbars.

Using the one or more properties of the individual solar cell pieces for allocating the solar cell pieces to solar cell arrangements can ensure that each solar cell arrangement includes only solar cell pieces of similar characteristics. Bottlenecks that would, for example, reduce a module power can be avoided.

According to some embodiments, which can be combined with other embodiments described herein, the apparatus 300 includes at least one of a first inspection device, a second inspection device, and a third inspection device. The first inspection device, the second inspection device, and the third inspection device can be configured to determine and/or measure at least one of the above mentioned properties of the solar cell, solar cell pieces and/or solar cell arrangement. In particular, the one or more properties, such as the geometric and/or physical properties, can be selected from the group consisting of geometric shape, electrical properties, optical properties, printing quality, and any combination thereof.

In some implementations, the first inspection device is configured to measure and/or determine one or more properties of a solar cell before the solar cell is separated into two or more solar cell pieces. As an example, the first inspection device is configured to measure and/or determine one or more properties of the first solar cell before the first solar cell is separated into the two or more first pieces. According to some embodiments, the second inspection device is configured to measure and/or determine one or more properties of at least some of the solar cell pieces, such as the two or more first solar cell pieces of the first solar cell, after the solar cell has been separated into said solar cell pieces. According to some embodiments, the third inspection device is configured to measure and/or determine one or more properties of at least one solar cell arrangement of the at least two solar cell arrangements, such as the first solar cell arrangement and/or the second solar cell arrangement.

According to some embodiments, which can be combined with other embodiments described herein, the apparatus 300 further includes a sorting device configured for sorting the at least two solar cell arrangements, such as the first solar cell arrangement and the second solar cell arrangement, based to a quality determination of the at least two solar cell arrangements. As an example, the sorting device is configured for sorting the at least two solar cell arrangements based on information received from the third inspection device. In particular, solar cell arrangements which are defective or have a low quality can be discarded. Optionally, defective solar cell arrangements can undergo a reworking or repair process, for example, to replace defective or low-quality solar cell pieces.

Figure 8B:
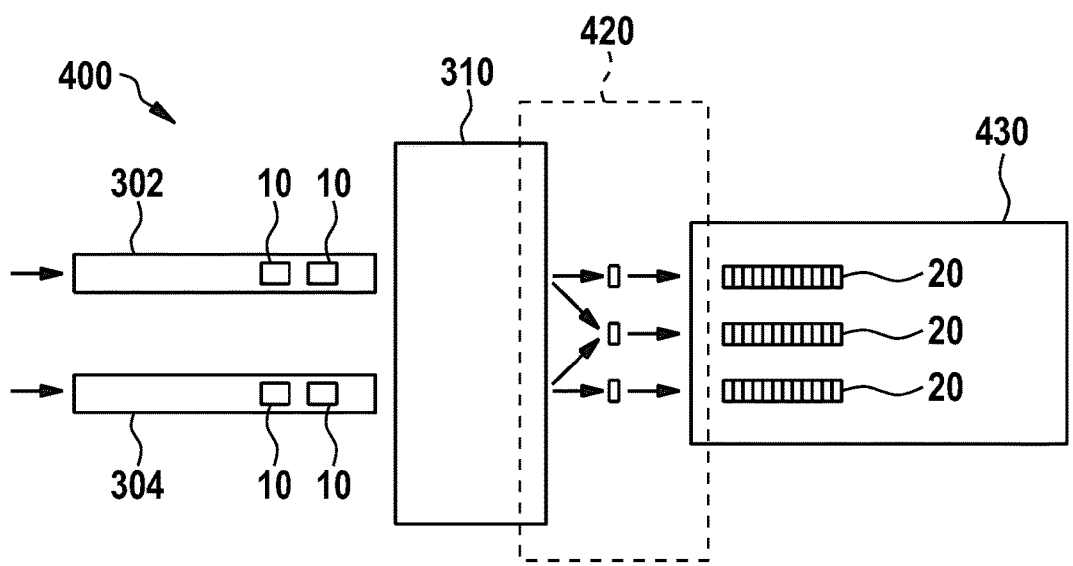
FIG. 8B shows a schematic view of an apparatus for manufacture of at least two solar cell arrangements according to further embodiments described herein.

FIG. 8B shows a schematic view of an apparatus 400 for manufacture of at least two solar cell arrangements according to a further embodiment described herein. The apparatus 400 of FIG. 8B is similar to the apparatus described with respect to FIG. 8A, and a description of similar or identical aspects is not repeated.

According to some embodiments, the support device 430 is a belt conveyor having one single belt on which the at least two solar cell arrangements can be assembled in parallel. In the example of FIG. 8B, three solar cell arrangements are assembled in parallel. As an example, pseudo-square solar cell can be inputted via the two or more input conveyors, such as the first input conveyor 302 and the second input conveyor 304. Each pseudo-square solar cell can be divided into, for example, four solar cell pieces. That is, each pseudo-square solar cell is divided into two edge pieces having the rounded edges and two middle pieces, which are full-square pieces.

The edge pieces of the pseudo-square solar cell inputted via the two or more input conveyors can be allocated to the middle solar cell arrangement of the three solar cell arrangements using the positioning device 420. The middle pieces, which are full-square pieces, can be allocated to outer two solar cell arrangements of the three second solar cell arrangements. A same number of solar cell pieces can be allocated to each solar cell arrangement of the three solar cell arrangements, and the solar cell arrangements can be assembled at the same speed.

Figure 8C:
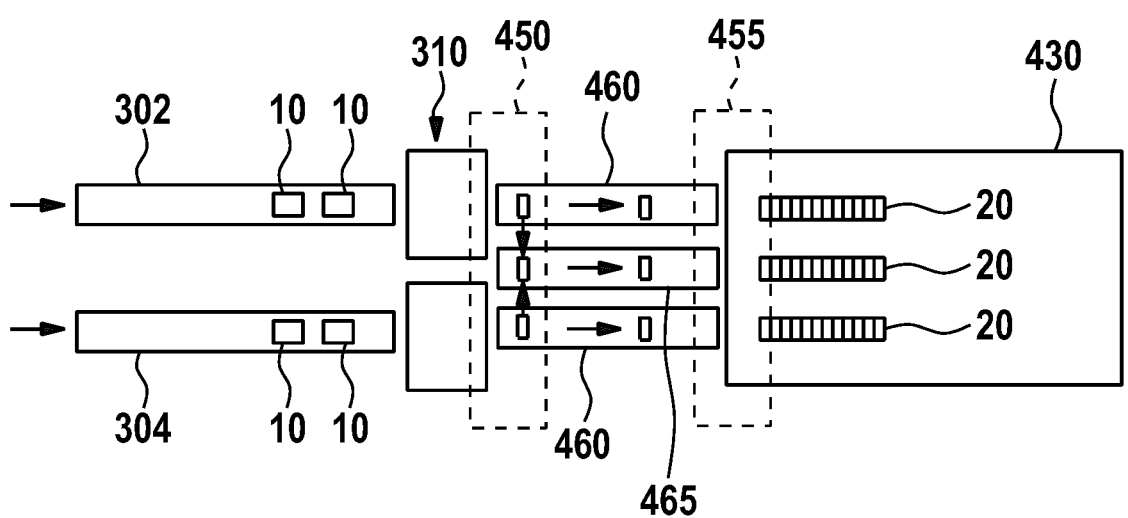
FIG. 8C shows a schematic view of an apparatus for manufacture of at least two solar cell arrangements according to yet further embodiments described herein.

FIG. 8C shows a schematic view of an apparatus for manufacture of at least two solar cell arrangements according to a yet further embodiment described herein. The apparatus of FIG. 8C is similar to the apparatuses described with respect to FIGS. 8A and B, and a description of similar or identical aspects is not repeated.

According to some embodiments, which can be combined with other embodiments described herein, the apparatus has a positioning arrangement including a displacement device 450 and the positioning device 455 described before. The displacement device 450 can be configured to laterally displace solar cell pieces provided by the separation device 310, for example, by the first cleaving device and the second cleaving device. In some implementations, the apparatus can have a plurality of parallel transport lanes provided at the separation device 310 and/or the positioning device 455. The plurality of transport lanes can be configured for transportation of the solar cell pieces after the cleaving process and prior to the positioning of the solar cell pieces on the support device 430. The plurality of transport lanes can be belt conveyors. In some implementations, the plurality of transport lanes can include two outer transport lanes 460 and a center transport lane 465.

In some embodiments, the two outer transport lanes 460 can be aligned (e.g., in line) with the first input conveyor 302 and the second input conveyor 304, respectively. The center transport lane 465 can be positioned between the first input conveyor 302 and the second input conveyor 304. In particular, selected solar cell pieces, such as the solar cell pieces (e.g., the edge pieces of the pseudo-square solar cells) used for assembling of the middle solar cell arrangement can be picked up by the displacement device 450 of the positioning device 455 to move or transfer the selected solar cell pieces after the cleaving process to the center transport lane 465. The outer transport lanes 460 can be configured for transportation of the middle pieces of the pseudo-square solar cells, which are full-square pieces.

It is to be understood that the plurality of transport lanes between the separation device and the positioning device/support device as described with respect to FIG. 8C can be similarly implemented in the apparatus described with respect to FIGS. 8A and B.

FIG. 9A shows a schematic view of a system 500 for manufacture of at least two shingled solar cells according to embodiments described herein. The system 500 can be part of, or constitute, a production line for shingled solar cells.

The system 500 includes the apparatus for manufacture of at least two solar cell arrangements, which are shingled solar cells, according to the embodiments described herein. The system 500 further includes a production tool 510 for manufacturing a plurality of solar cells including the first solar cell. The plurality of solar cells are input into the apparatus. The apparatus includes the separation device 530, the positioning device 540, and the support device 550 according to the embodiments described therein.

In some implementations, the production tool 510 includes one or more printing devices configured for printing one or more conductive lines on solar cell substrates used in the manufacture of the plurality of solar cells. The one or more conductive lines are selected from fingers and busbars. The one or more printing devices can be configured for double printing of the one or more conductive lines. Specifically, the one or more printing devices can be configured for double printing of at least one of the fingers and busbars.

According to some embodiments, the system 500, and particularly the apparatus, includes an adhesive application device 520 configured to apply an adhesive to the solar cell before the solar cell is separated into the two or more solar cell pieces. The adhesive is applied to portions of the solar cell corresponding to an overlapping region between two adjacent solar cell pieces that are arranged on the support device 550 in the overlapping manner. According to some embodiments, the adhesive application device 520 can be configured to apply the adhesive on at least a portion of the conductive line pattern, such as the busbars, of the solar cell.

According to some embodiments, which can be combined with other embodiments described herein, the separation device 530 includes the at least one solar cell perforation device. As an example, the at least one solar cell perforation device includes, or is, a laser. As an example, the at least one solar cell perforation device can be configured to perforate the solar cell before the solar cell is separated into the two or more solar cell pieces.

In some implementations, the system 500 further includes a heating device 560, for example, subsequent to, or above, the support device 550 of the apparatus. An embodiment of the heating device 560 is described with respect to FIG. 5. In particular, the heating device 560 is configured to heat at least one of the solar cell arrangements to dry the adhesive in the overlapping region between two adjacent solar cell pieces. The heating device 560 can be selected from the group consisting of conduction heaters (e.g., hot plates), convective heaters, resistive heaters, infrared heaters, lamp heaters, hot air heaters, and any combination thereof.

According to some embodiments, which can be combined with other embodiments described herein, the system 500 includes a sorting device 570 configured for sorting the at least two solar cell arrangements, such as the first solar cell arrangement and the second solar cell arrangement, based on a quality determination of the at least two solar cell arrangements. As an example, solar cell arrangements which are defective or have a low quality can be discarded. Optionally, defective solar cell arrangements can undergo a reworking or repair process, for example, to replace defective or low-quality solar cell pieces FIG. 9B shows a schematic view of a system 600 for manufacture of at least two shingled solar cells according to further embodiments described herein. The system 600 is similar to the system described with respect to FIG. 9A and a description of similar or identical aspects is not repeated. In particular, the system 600 includes the production tool 510, the adhesive application device 520, the apparatus, the heating device 560, and the sorting device 570.

According to some embodiments, which can be combined with other embodiments described herein, the system 600 includes an inspection arrangement. The inspection arrangement can include at least one of a first inspection device 615, a second inspection device (may be included in the apparatus, for example, in the positioning device 540), and a third inspection device 665. The first inspection device 615, the second inspection device, and the third inspection device 665 can be configured to determine and/or measure one or more properties, such as geometric and/or physical properties, of at least one of the solar cell, solar cell pieces and/or solar cell arrangement as described with respect to the embodiments described herein. In particular, the one or more properties can be selected from the group consisting of geometric shape, electrical properties, optical properties, printing quality, and any combination thereof.

In some implementations, the first inspection device 615 is configured to measure and/or determine one or more properties of a solar cell before the solar cell is separated into two or more solar cell pieces. Although the first inspection device 615 is exemplarily illustrated as being positioned between the production tool 510 and the adhesive application device 520, the present disclosure is not limited thereto. An example, the first inspection device 615 can be provided between the adhesive application device and the separation device 530 or can be integrated into the production tool 510, the adhesive application device 520, or the separation device 530.

According to some embodiments, the second inspection device is configured to measure and/or determine one or more properties of at least some of the solar cell pieces after the solar cell has been separated into pieces. The second inspection device can be integrated into the apparatus, for example, in the separation device 530 or the positioning device 540. In further implementations, the second inspection device can be provided as a separate entity.

In some embodiments, the third inspection device 665 is configured to measure and/or determine one or more properties of the at least two solar cell arrangements, such as the first solar cell arrangement and/or the second solar cell arrangement. Although the third inspection device 665 is exemplarily illustrated as being positioned between the heating device 560 and the sorting device 570, the present disclosure is not limited thereto. An example, the third inspection device 665 can be provided at the support device 550. In some implementations, the support device 550, the heating device 560, and the third inspection device 665 are integrated in a single entity or process station.

Figure 10:
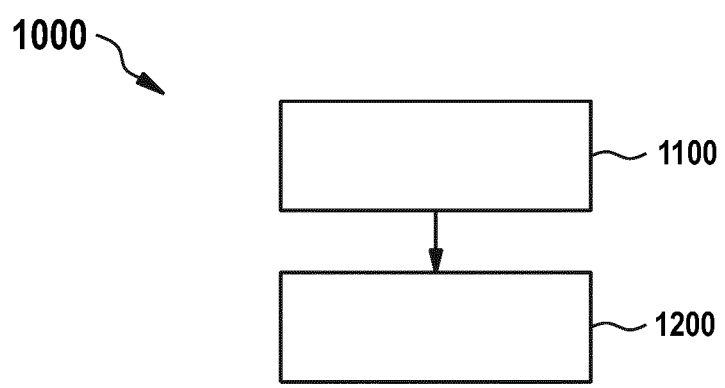
FIG. 10 shows a flow chart of a method for manufacture of at least two solar cell arrangements according to embodiments described herein.

FIG. 10 shows a flow chart of a method 1000 for manufacture of at least two solar cell arrangements, such as shingled solar cells, according to embodiments described herein. The method 1000 can use the apparatuses and systems according to the embodiments described herein. Likewise, the apparatuses and systems of the present disclosure can be configured to implement the method 1000.

The method 1000 includes in block 1100 a separating of each solar cell of one or more solar cells into two or more solar cell pieces, and in block 1200 a forming of at least a first solar cell arrangement and a second solar cell arrangement of the at least two solar cell arrangements from the two or more solar cell pieces. Each solar cell piece of the two or more solar cell pieces is allocated to the first solar cell arrangement or the second solar cell arrangement based on one or more geometric and/or physical properties of the solar cell piece. In some implementations, the one or more solar cells are selected from the group consisting of full-square solar cells and pseudo-square solar cells.

In some implementations, the solar cells can be centered using, for example, the centering device, to adjust a position of the solar cells before the solar cells are cleaved into the two or more solar cell pieces. Optionally, an inspection system, such as the second inspection device, can be used for an alignment of the solar cell pieces held, for example, by the positioning device, before the solar cell piece is put on the support device. Information acquired by the inspection system can be used for closed-loop control and a positioning of subsequent solar cell pieces.

According to some embodiments, the one or more geometric and/or physical properties are selected from the group consisting of geometric shape, electrical properties, optical properties, and any combination thereof. The one or more geometric and/or physical properties can be determined using at least one of the first inspection device, the second inspection device and the third inspection device according to the embodiments described herein.

In some implementations, solar cell pieces of the two or more solar cell pieces corresponding to a predetermined geometric shape are allocated to either the first solar cell arrangement or the second solar cell arrangement. The predetermined geometric shape can correspond to the edge pieces of the pseudo-square solar cells having the rounded edges, the middle pieces of the pseudo-square solar cells, or the solar cell pieces provided by the full-square solar cells, which are full-square solar cell pieces. As an example, the edge pieces of the pseudo-square solar cells having the rounded edges can correspond to a first predetermined geometric shape, the middle pieces of the pseudo-square solar cells can correspond to a second predetermined geometric shape, and the solar cell pieces provided by the full-square solar cells, which are full-square solar cell pieces, can correspond to a third predetermined geometric shape.

According to some embodiments, which can be combined with other embodiments described herein, a geometric shape of the solar cell pieces can be determined or examined, for example, using the second inspection device. In particular, it can be determined whether the edges of the solar cell pieces have irregularities, for example, caused by the cleaving process. Solar cell pieces having such irregularities can either be discarded or can be allocated to a low-quality solar cell arrangement.

In some embodiments, the method 1000 further includes a determining of the one or more geometric and/or physical properties at least one of before the separating of each solar cell and after the forming of the first solar cell arrangement and the second solar cell arrangement. As an example, the determining of the one or more geometric and/or physical properties before the separating of each solar cell can be conducted by the first inspection device. The determining of the one or more geometric and/or physical properties after the forming of the first solar cell arrangement and the second solar cell arrangement can be conducted by the third inspection device.

According to some embodiments, which can be combined with other embodiments described herein, each solar cell of the one or more solar cells is separated into two, three, four, five, six, or more solar cell pieces. The number of solar cell pieces into which each solar cell is separated can be selected according to at least one of a type of the solar cell (e.g., pseudo-full square or full-square), a number of solar cell arrangements that are to be assembled in parallel, and a configuration of the support device (e.g., one single belt or multiple support units having separate belts).

Figure 6B:
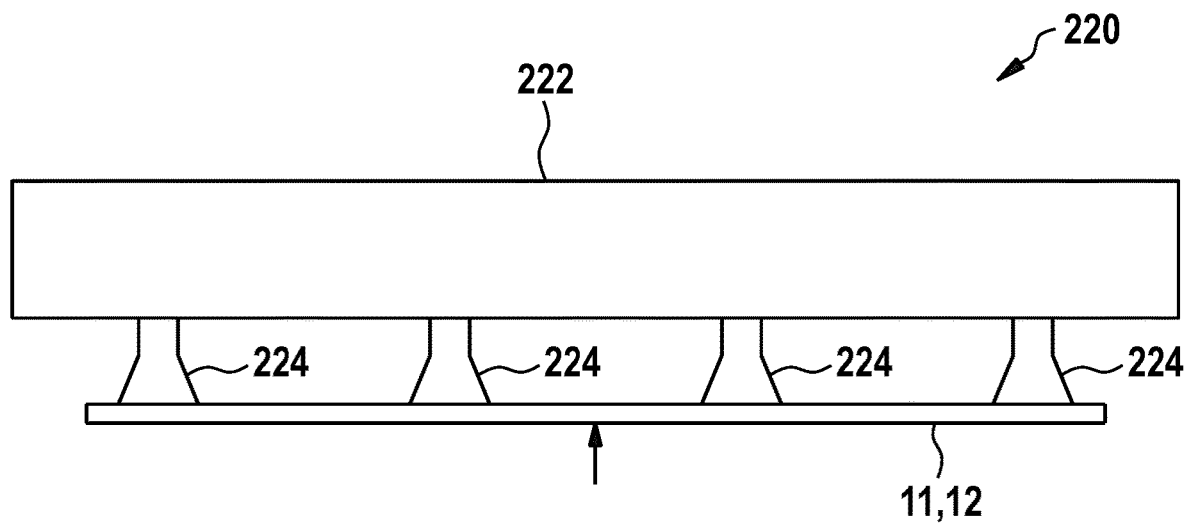

In some implementations, the method 1000 further includes a gripping of the two or more solar cell pieces and a positioning of the two or more solar cell pieces on the support device to form the first solar cell arrangement and the second solar cell arrangement. The gripping can be performed using the positioning device as described, for example, with respect to FIGS. 4 and 6. In particular, a suction force provided by a vacuum gripper can be used to pick up the solar cell piece.

According to some embodiments, the method 1000 further includes an applying of an adhesive to the solar cell or the two or more solar cell pieces before positioning the two or more solar cell pieces on the support device. In particular, the adhesive can be applied in the overlapping region of two adjacent solar cell pieces. According to some embodiments, the adhesive is an electrically conductive adhesive selected from the group consisting of solder, silver paste, and electrically conductive silicone adhesive. In some implementations, the method 1000 can include a drying of the adhesive while the two or more pieces are fixed to, or held on, the support device. The drying can be performed using the heating device, such as an infrared heater. The heating device can be provided at the support device and can heat the solar cell arrangement while the solar cell arrangement is moved or transported below the heating device.

According to some embodiments, which can be combined with other embodiments described herein, the following sequence can be used in the manufacture of the solar cell arrangement, such as the shingled solar cell.

a) using a laser (separator device) for perforation of the solar cells b) inspection for quality check of solar cells before separating with the separation device (separator)

c) applying an adhesive (conductive glue/paste deposition)

d) cleaving (separation into a plurality of pieces)

e) inspection for quality check after separator (optional)

f) inspection with cameras for alignment g) positioning of solar cell pieces on support device (belt; hypercell formation)

h) heating (e.g., with lamps or resistors)

i) hypercell inspection for classification

It is to be understood that the above sequence is only an example, and that process aspects can be arranged in a different order, one or more process aspects can be omitted, and/or one or more process aspects can be added.

According to embodiments described herein, the method for manufacture of at least two solar cell arrangements can be conducted using computer programs, software, computer software products and the interrelated controllers, which can have a CPU, a memory, a user interface, and input and output devices being in communication with the corresponding components of the apparatus for processing a large area substrate.

Figure 11:
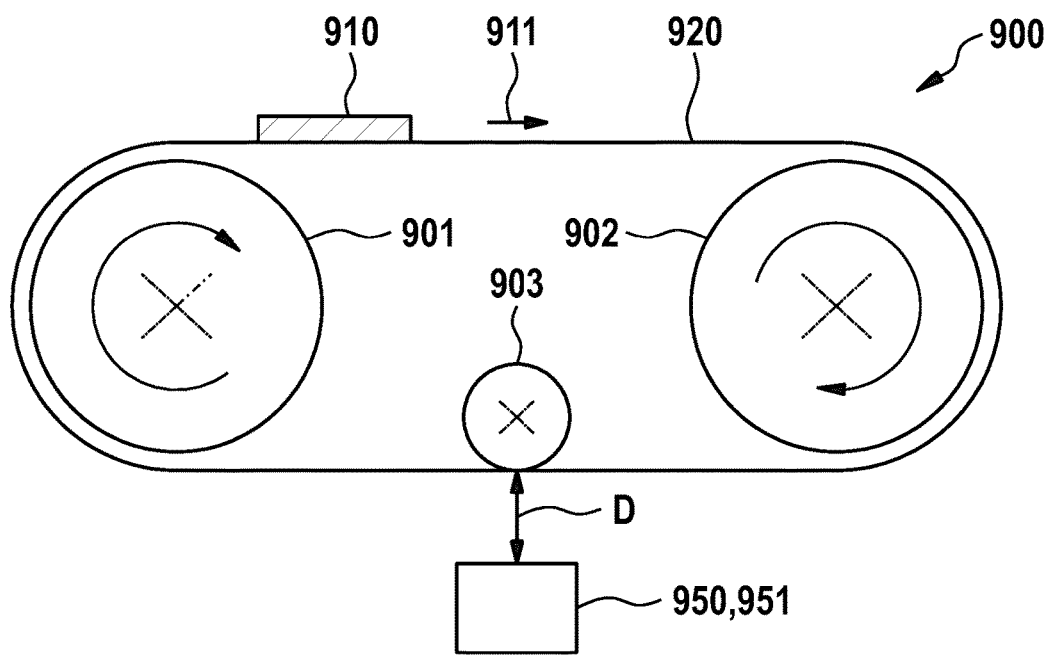
FIG. 11 shows a schematic side view of an electrostatic support device according to embodiments described herein.

FIG. 11 shows a schematic side view of a support device, which is an electrostatic support device 900, according to embodiments described herein. The electrostatic support device 900 can be used in the apparatus for manufacture of at least one solar cell arrangement according to the embodiments described herein.

As exemplarily shown in FIG. 11, the support device 900 is configured for conveying at least one solar cell element 910 (the terms "solar cell element" and "solar cell piece" are used synonymously throughout the present disclosure) in a transport direction 911. In particular, the support device includes a support element 920 (e.g., the belt) configured for supporting the at least one solar cell element 910. For example, the support element 920 may be a belt conveyor as exemplarily shown in FIG. 11. Typically, the support device 900 includes a first rotatable roller 901 and a second rotatable roller 902 for moving the support element 920 in the transport direction 911. Further, according to embodiments described herein, the support device includes an electric arrangement 950 configured for providing an electrostatic force for holding the at least one solar cell element 910 on the support element 920. In particular, the electrostatic force may act between the support element 920 and the at least one solar cell element 910.

Accordingly, a support device is provided which may beneficially be used for holding and conveying photovoltaic panel elements during production, e.g. during drying or serigraphic processes. In particular, embodiments of the electrostatic support device as described herein provide an alternative for conventional vacuum holding devices. Accordingly, beneficially embodiments of the support device as described herein provide for a simplified construction compared to vacuum holding devices because a complicated vacuum supply system can be omitted. Further, providing a support device having a belt conveyor as support element may particularly be beneficial for moving transport thin sheet-like elements, e.g. solar cell pieces or elements, between different processing stations in a continuous mode.

In the present disclosure, the term "support device" is to be understood as a device which is configured for supporting an element, for example a sheet like element such as a solar cell piece or solar cell arrangement. In particular, a "support device" as described herein may be understood as a device which is configured for supporting an element in a substantially horizontal orientation. In this regard, a "horizontal orientation" may be understood as an orientation in which the orientation of the longitudinal axis of the element supported by the support device deviates from an orientation which is perpendicular to the direction of gravitational force by ±10° or less, particularly by ±5° or less, more particularly by ±2° or less.

With exemplarily reference to FIG. 11, according to embodiments which can be combined with any other embodiments described herein, the support device 900 can include at least one first roller 901 and at least one second roller 902 configured for moving the support element 920 in the transport direction 911. In particular, as indicated by the arrows around the axis of the first roller 901 and the second roller 902, the first roller 901 and the second roller 902 may be rotatable in order to move the support element 920, particularly the conveyor belt, in the transport direction 911. For example, the first roller 901 and/or the second roller 902 may be connected to a drive in order to provide a rotational movement. Typically, the outer surfaces of the first roller 901 and the second roller 902 are in contact with the support element 920 in order to provide a frictional force between the first roller 901 and the support element 920 as well as between the second roller 902 and the support element 920. Accordingly, by rotation of the first roller 901 and the second roller the support element 920 may be moved in the transport direction 911, as exemplarily indicated in FIG. 11.

In the present disclosure, the term "support element" is to be understood as an element of the support device which is configured for supporting or holding a sheet-like element such as a solar cell element. In particular, the "support element" as described herein may be configured for providing a flat contact surface for the sheet-like element to be supported. In this regard, it is to be understood that the orientation of the flat contact surface may be horizontal, i.e. being perpendicular to the direction of gravitational force within a range of ±10° or less, particularly within a range of ±5° or less, more particularly within a range of ±2° or less. Typically, a "support element" as described herein may have a flexible structure, such that the support element can be employed as a conveyer belt which is guided by one or more rollers in order to move the support element in a transport direction, as exemplarily described above with reference to FIG. 11.

With exemplary reference to FIG. 11, according to embodiments which can be combined with any other embodiments described herein, the electric arrangement 950 includes a charging source 951 configured for providing an electrostatic charge to the support element 920. For example, the charging source 951 may be arranged in proximity to the support element 920. In particular, as exemplary indicated in FIG. 11, the charging source 951 may be arranged relative to the support element 920 within a distance D of D≤10 mm, particularly D≤5 mm, more particularly D≤2 mm.

According to embodiments which can be combined with any other embodiments described herein, the charging source 951 may be a voltage source configured for providing a voltage of at least 5 kV, particularly at least 8 kV, for example 10 kV±1 kV. In particular, the charging source 951 may be connected to a controller configured for controlling the voltage, e.g. within a voltage range from 5 kV to 11 kV.

Accordingly, it is to be understood that according to embodiments described herein the charging source 951 is configured for providing an electrostatic induction to the support element 920 in order to build up an electrostatic force on the support element 920 for holding a sheet-like element, e.g. at least one solar cell element, on the support element 920.

According to some embodiments, the support device 900 may be a monopolar electrostatic support device. In particular, in the present disclosure a "monopolar electrostatic support device" may be understood as a support device having one or more charging sources which provide an electric charge of the same electric polarity to the support element 920. For example, according to embodiments which can be combined with any other embodiment described herein, a positive voltage may be applied to the one or more charging sources such that a negative charge is induced to the support element, particularly on the surface of the support element. Alternatively, a negative voltage may be applied to the one or more charging sources such that a positive charge is induced to the support element, particularly on the surface of the support element.

According to other embodiments, the support device 900 may be a bipolar electrostatic support device. In particular, in the present disclosure a "bipolar electrostatic support device" may be understood as a support device having two or more charging sources which provide an electric charge of different electric polarity to the support element 920. For example, according to embodiments which can be combined with any other embodiment described herein, a positive voltage may be applied to a first charging source of the one or more charging sources and a negative voltage may be applied to a second charging source of the one or more charging sources. Accordingly, corresponding negatively charged regions and corresponding positively charged regions may be generated at the support element, particularly at the surface of the support element by electrostatic induction.

According to embodiments which can be combined with any other embodiments described herein, the electric arrangement 950 includes an electrical grounding for grounding the support element 920. For example, the electrical grounding may be provided by at least one roller of the first roller 901 and the second roller 902. Additionally or alternatively, the electrical grounding may be provided by a separate grounding roller 903 configured for grounding the support element 920, as exemplary shown in FIG. 11. For example, the grounding roller 903 may be arranged in between the first roller 901 and the second roller 902. In particular, the grounding roller 903 may be arranged for contacting a surface of the support element 920, as exemplary shown in FIG. 11. Typically, the grounding roller 903 is arranged, such that the outer surface of the grounding roller is in contact with an inner surface of the support element. In this regard, it is to be understood that the "inner surface of the support element" is a surface of the support element which is opposite to the outer surface of the support element which contacts the at least one solar cell element being supported by the support element.

Figure 12:
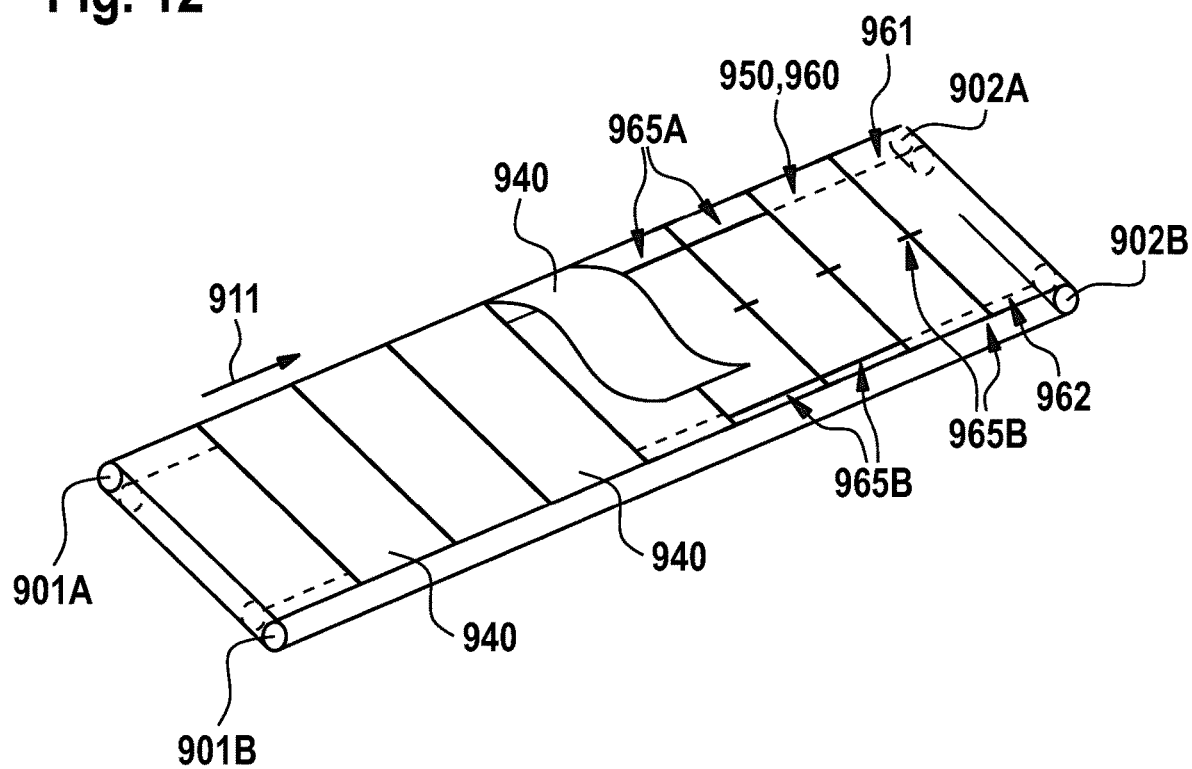
FIG. 12 shows a schematic perspective view of an electrostatic support device according to further embodiments described herein.
Figure 13:
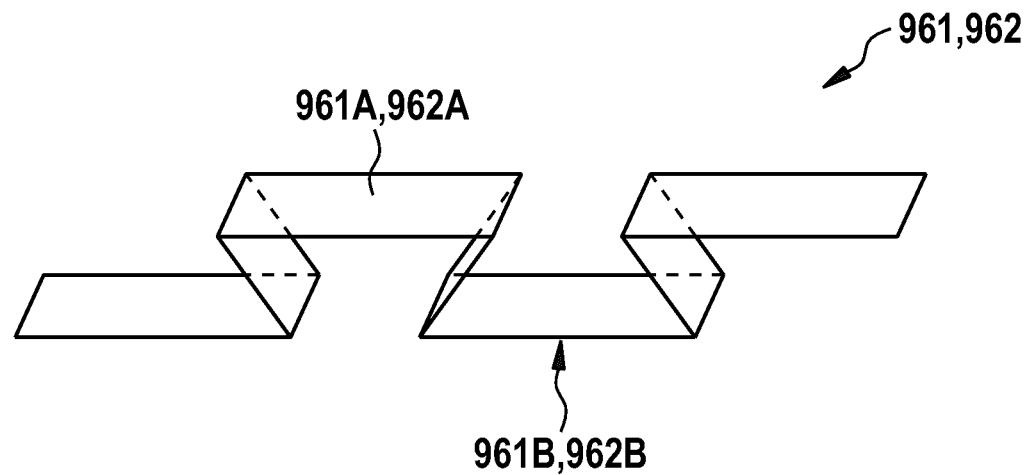
FIG. 13 shows a schematic view of a part of an electric arrangement for providing an electrical charge to the electrostatic support device according to some embodiments described herein.

With exemplary reference to FIG. 12, according to embodiments which can be combined with any other embodiments described herein, the electric arrangement 950 of the support device 900 includes at least one conductive arrangement 960 configured for receiving an electrostatic charge from the charging source 951. In particular, the at least one conductive arrangement 960 is configured for providing the electrostatic force for holding the at least one solar cell element 910 on the support element 920. For example, the at least one conductive arrangement 960 may be attached to or incorporated within the support element 920.

Accordingly, in the present disclosure, the term "electric arrangement" is to be understood as an arrangement including a conductive arrangement which is attached to or incorporated within the support element 920. Accordingly, in the present disclosure a "conductive arrangement" is to be understood as an arrangement of conductive elements, e.g. wires of conductive material such as copper, configured for receiving an electrostatic charge from a charging source as described herein. Accordingly, an electrostatic force for holding the at least one solar cell element on the support element can be provided by the conductive arrangement as described herein.

With exemplary reference to FIG. 12, according to embodiments which can be combined with any other embodiments described herein, the at least one conductive arrangement 960 may include a first busbar 961 and/or a second busbar 962. In particular, the first busbar 961 and/or the second busbar 962 may be arranged parallel to the transport direction 911, as exemplary shown in FIG. 11. According to some embodiments which can be combined with other embodiments described herein, the first busbar 961 and/or the second busbar 962 are made of conductive material, e.g. copper wire, and are configured to transfer a charge to the support element 920. For example, in the case of a bipolar configuration of the support device two first rollers 901A, 901B and two second rollers 902A, 902B may be provided, as exemplary shown in FIG. 12. In particular, a first pair of a first roller 901A and a second roller 902A may be electrically connected by the first busbar 961 and a second pair of a first roller 901B and a second roller 902B may be electrically connected by the second busbar 962. In order to supply an electrical charge of positive polarity to the first busbar 961, the first pair of first roller 901A and second roller 902A may be provided with inside rotary joints with sliding contacts for supplying a voltage of +5 kV or less, e.g. +4 kV. Accordingly, in order to supply an electrical charge of negative polarity to the second busbar 962, the second pair of first roller 901B and second roller 902B may be provided with inside rotary joints with sliding contacts for supplying a voltage of −5 kV or less, e.g. −4 kV.

Figure 14A:
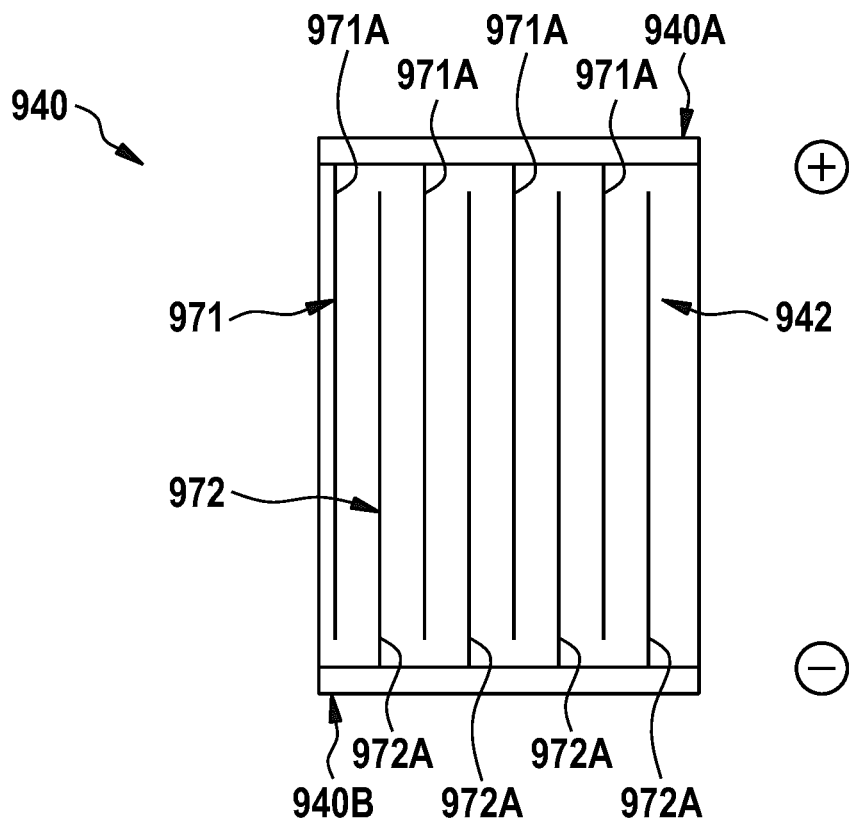
FIG. 14A shows a schematic top view of a flexible panel of the electrostatic support device according to embodiments described herein.
Figure 14B:
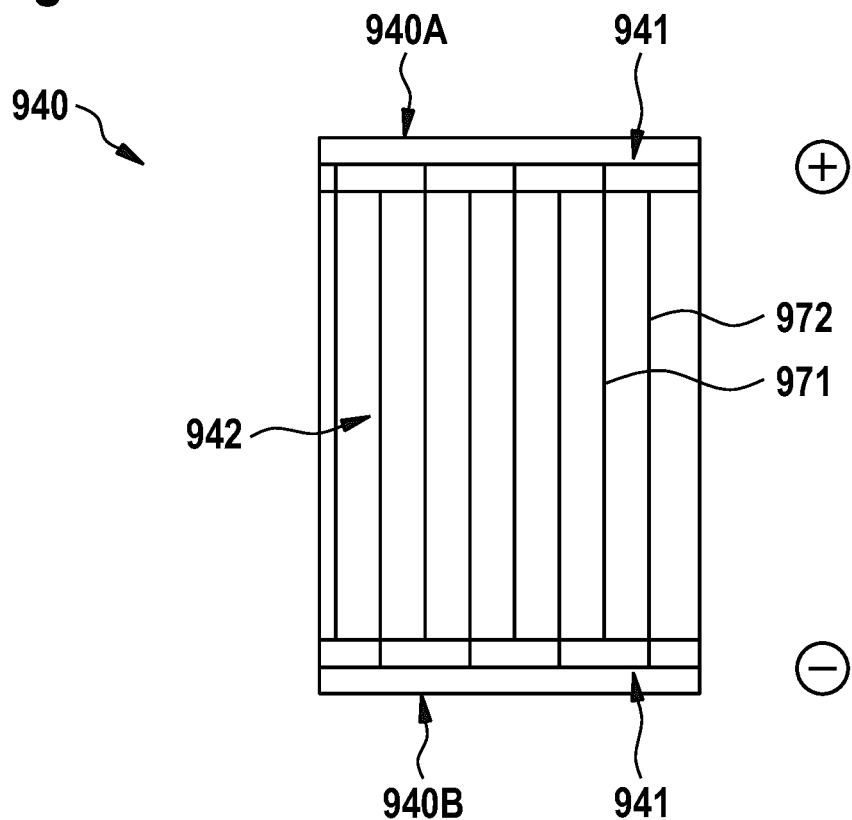
FIG. 14B shows a schematic back view of a flexible panel of the electrostatic support device according to embodiments described herein.

According to embodiments which can be combined with any other embodiments described herein, the at least one conductive arrangement 960 may include at least one electrode arrangement, e.g. a first electrode arrangement 971 and/or a second electrode arrangement 972 as exemplarily shown in FIGS. 14A and 14B. For example, the first electrode arrangement 971 may be electrically connected to the first busbar 961 and the second electrode arrangement 972 may be electrically connected to the second busbar 962. According to some embodiments, the first electrode arrangement 971 and/or the second electrode arrangement 972 may be provided within at least one flexible panel 940, as exemplarily shown in FIGS. 12, 14A and 14B.

According to embodiments which can be combined with any other embodiments described herein, the support element 920 may include multiple flexible panels which can be provided along the length of the support element 920, as exemplarily shown in FIG. 12. As shown in FIG. 12, the multiple flexible panels may be arranged parallel to each other along the length of the support element. Further, the support element 920 may be provided with markers which may be beneficial for mounting the flexible panels onto the support element at preselected positions.

According to embodiments which can be combined with any other embodiments described herein, the first busbar 961 may be arranged within the support element 920 such that first contact regions 965A for providing an electrical contact between the first busbar 961 and the first electrode arrangement 971 is provided. Accordingly, the second busbar 962 may be arranged within the support element 920 such that second contact regions 965B for providing an electrical contact between the second busbar 962 and the second electrode arrangement 972 is provided. For example, as exemplary shown in FIG. 13, the first busbar 961 and/or the second busbar 962 may be arranged within the support element 920, such that a first portion 961A of the first busbar 961 and/or a first portion 962A of the second busbar 962 are/is exposed to the surface of the support element 920 to which the flexible panels 940 may be mounted. Further, the first busbar 961 and/or the second busbar 962 may be arranged within the support element 920, such that a second portion 961B of the first busbar 961 and/or a second portion 962B of the second busbar 962 are/is exposed to the surface of the support element 920 which is in contact with the first roller 901 and/or the second roller 902. More specifically, the first busbar 961 and/or the second busbar 962 may be arranged within the support element 920 in an alternating zig-zag pattern, as exemplary shown in FIG. 13.

According to embodiments which can be combined with any other embodiments described herein, the support element includes at least one material selected from the group consisting of: polytetrafluoroethylene (PTFE); fiber-reinforced polymer, particularly carbon-fiber-reinforced polymer; fiber-reinforced glass, polyamide and other suitable materials. Accordingly, beneficially the support element as described herein is configured for being flexible and providing a mechanical support for the first busbar and/or the second busbar and/or the flexible panels.

FIGS. 14A and 14B show a schematic top view of a flexible panel of the support element and a schematic back view of a flexible panel of the support element according to some embodiments described herein. As exemplary shown in FIGS. 14A and 14B, according to embodiments which can be combined with any other embodiments described herein, the at least one conductive arrangement 960 may include a first electrode arrangement 971 and/or a second electrode arrangement 972. In particular, the first electrode arrangement 971 and/or the second electrode arrangement 972 may include multiple electrodes extending from a first side 940A of the flexible panel 940 towards an opposing second side 940B of the flexible panel 940, as exemplary shown in FIGS. 4A and 4B. For example, the first electrodes 971A of the first electrode arrangement 971 and the second electrodes 972A of the second electrode arrangement 972 may be arranged in an alternating staggered manner. Accordingly, it is to be understood that the flexible panels 940 may be include neighboring electrodes which can be provided with opposite charge, as exemplarily indicated in FIGS. 14A and 14B.

According to embodiments which can be combined with any other embodiments described herein, the first electrodes 971A and the second electrodes 972A may be arranged parallel to each other. For example, the first electrodes 971A and the second electrodes 972A may be configured as straight lines as exemplarily shown in FIGS. 14A and 14B. Alternatively, the first electrodes 971A and the second electrodes 972A may have a different shape, for example the first electrodes 971A and the second electrodes 972A can be configured to have a zig-zag pattern, a wavelike pattern, or the like.

According to embodiments which can be combined with any other embodiments described herein, the first electrode arrangement 971 and/or the second electrode arrangement 972 are provided within the at least one flexible panel 940, as exemplarily shown in FIGS. 14A and 14B. In particular, the first electrode arrangement 971 and/or the second electrode arrangement 972 may be at least partially embedded in the material forming the flexible panel 940. For example, the flexible panel 940 can be made of a flexible polymer such as polyamide.

More specifically, according to embodiments which can be combined with any other embodiments described herein, the top side of the flexible panel, i.e. the surface of the flexible panel which may contact the at least one solar cell element when the at least one solar cell element is supported by the support element, is completely covered by the flexible polymer structure 942, e.g. a layer of polyamide. Typically, the flexible polymer structure 942 forms the main part of the flexible panel. Accordingly, it is to be understood that the electrodes of different polarity of the first electrode arrangement and the second electrode arrangement are integrated inside the flexible panel. Further, according to embodiments which can be combined with any other embodiment described herein, the flexible panel 940, particularly opposing backsides of the flexible panel, may include an adhesive portion 941 configured for attaching the flexible panel 940 to the support element 920. In particular, the adhesive portion 941 may be provided by two or more adhesive portions which are arranged on opposing lateral edges of the flexible panel 940, as exemplarily shown in FIG. 14B. Typically, the adhesive portion 941 includes a portion of the first electrode arrangement 971 and/or the second electrode arrangement 972 which is configured for contacting the first busbar 961 and/or the second busbar 962 when the flexible panel 940 is attached to the support element 920.

Accordingly, with exemplary reference to FIGS. 12, 14A and 14B, it is to be understood that according to embodiments which can be combined with any other embodiments described herein, the at least one flexible panel 940 can be releasable attached to the support element 920. Accordingly, beneficially a support device 900 for conveying at least one solar cell element 910 is provided with modular and exchangeable flexible panels which are configured for providing an electrostatic force for holding the at least one solar cell element on the support element. Accordingly, beneficially embodiments of the support device as described herein provide for easy maintenance and replacement of flexible panels of the support device.

Figure 15:
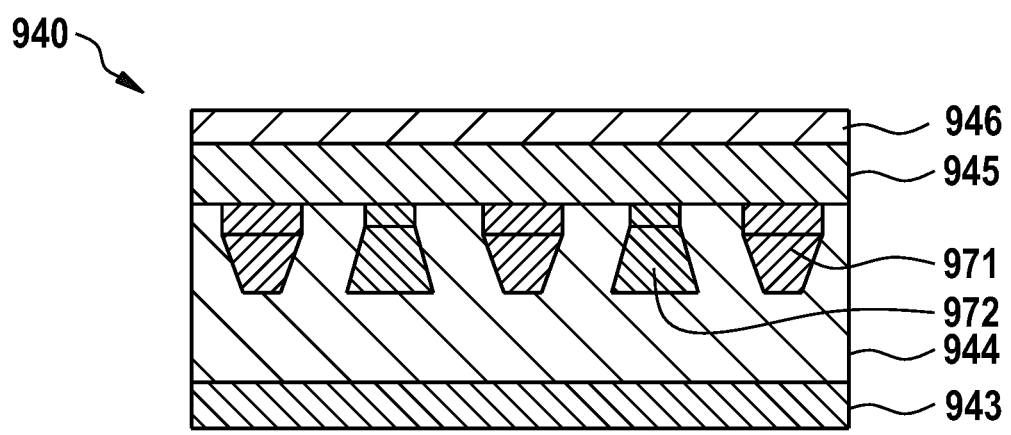
FIG. 15 shows a cross-sectional view of a layer structure of a flexible panel of the electrostatic support device according to embodiments described herein.

In FIG. 15 a detailed cross-sectional view of a layer structure of a flexible panel of the support element according to embodiments described herein is shown. In particular, the flexible panel may include a multilayer structure having a bottom adhesive layer 943, a bottom supporting layer 944, an intermediate adhesive layer 945 and a cover layer 946, as exemplary shown in FIG. 15. Typically, the first electrode arrangement 971 and/or the second electrode arrangement 972 are/is arranged between bottom adhesive layer 943 and the cover layer 946, more specifically between the bottom supporting layer 944 and the intermediate adhesive layer 945, as exemplarily indicated in FIG. 15.

Figure 16:
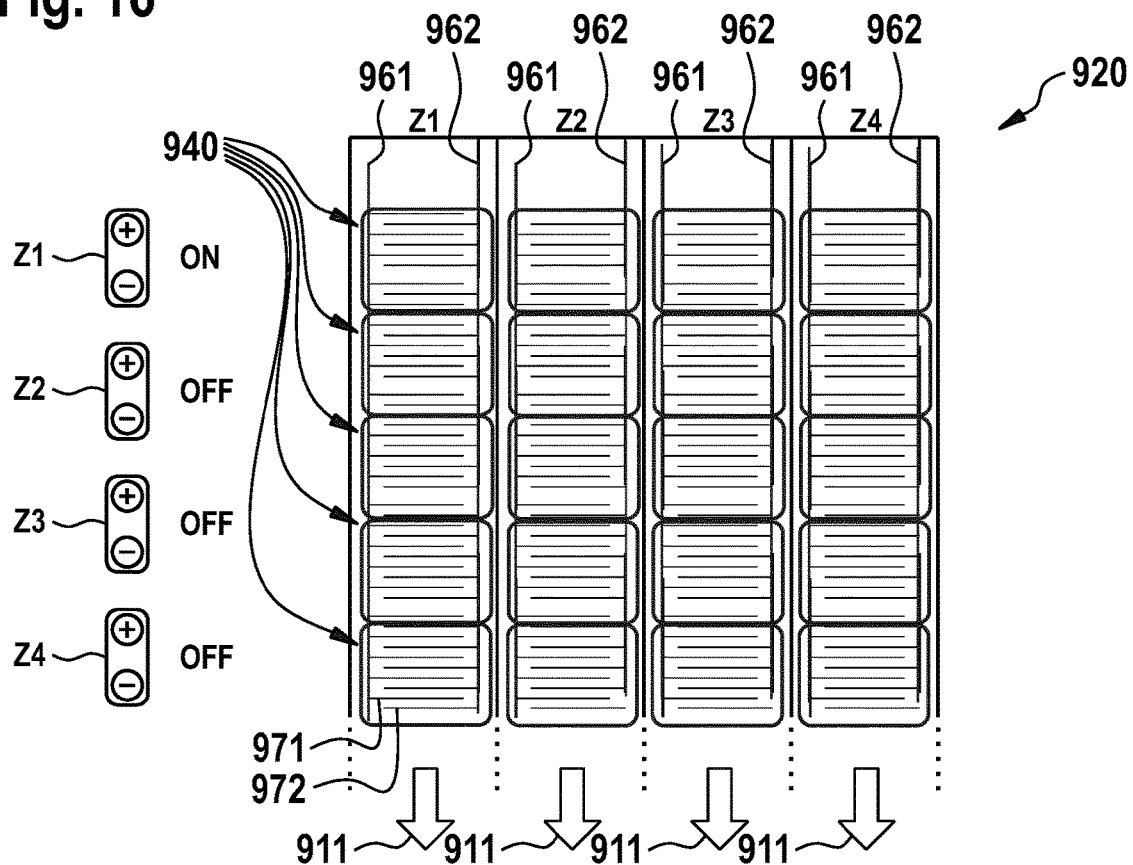
FIG. 16 shows a schematic view of an electrostatic support device having a multi-control configuration according to some embodiments described herein.
Figure 17:
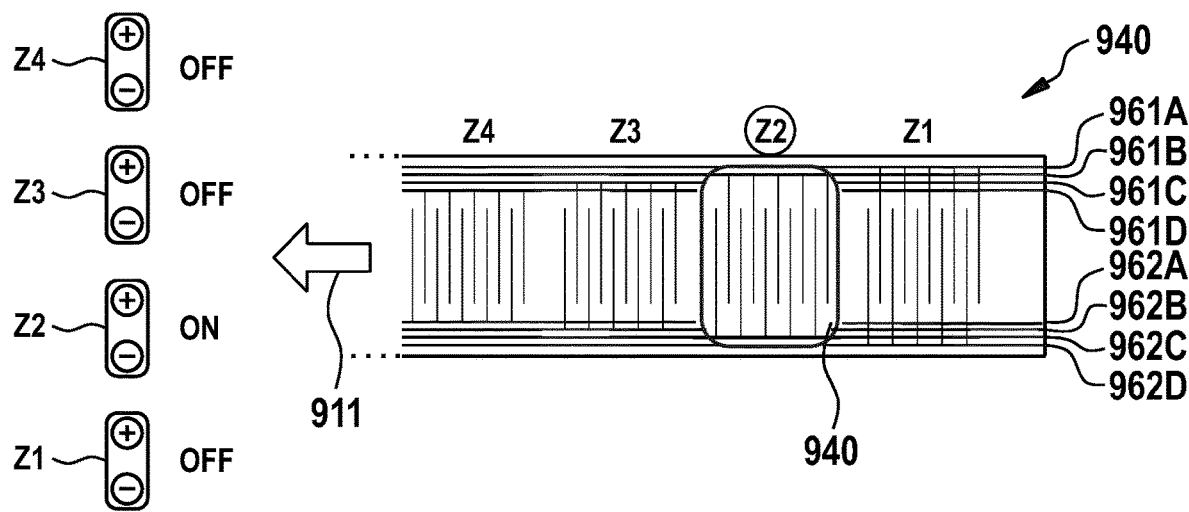
FIG. 17 shows a schematic view of an electrostatic support device having a multi-control configuration according to some further embodiments described herein.

With exemplary reference to FIGS. 16 and 17, according to embodiments which can be combined with any other embodiments described herein, the support element 920 may include two or more controllable regions which can be controlled with respects to the electrostatic force for holding the at least one solar cell element on the support element. In particular, the two or more controllable regions may for example be switched between an "on"-state and an "off"-state. The "on"-state may be a state in which an electrostatic force is generated and the "off"-state state may be a state in which no electrostatic force is generated. Accordingly, beneficially a controllable support device can be provided in which various regions of a support element can selectively be controlled in order to provide a local electrostatic force for holding a sheet-like element, particularly a solar cell element, on the support element.

According to embodiments which can be combined with any other embodiments described herein, the support element 920 may include a first controllable region Z1, a second controllable region Z2, a third controllable region Z3 and a fourth controllable region Z4, as exemplary shown in FIG. 16. In particular, the controllable regions may be arranged parallel to each other, particularly parallel to the transport direction 911, as exemplary shown in FIG. 16. Each of the controllable regions may include a first busbar 961 and a second busbar 962 as described herein. Accordingly, each of the first busbars and the second busbars of the individual controllable regions Z1-Z4 may be supplied with an electrical charge as exemplarily described with reference to FIGS. 11 and 12. Further, as exemplary shown for the first controllable region Z1, at least one flexible panel 940 may be provided at the two or more controllable regions.

With exemplary reference to FIG. 17, according to embodiments which can be combined with any other embodiments described herein, the support element 920 may be configured such that individual flexible panels can be controlled separately from each other. In particular, the individual flexible panels may be controlled such that the flexible panels can be switched from an "on"-state in which an electrostatic force is generated to an "off"-state in which no electrostatic force is present. Accordingly, the support element 920 can be configured such that two or more flexible panels as described herein can be provided with an electrical charge. For example, the support element 920 may include four first busbars 961A-961D and four second busbars 962A-962D, which are arranged such that for example four flexible panels Z1-Z4 as described herein can individually be provided with an electrical charge separately from each other.

In view of the embodiments of the electrostatic support device as described in the present disclosure, it is to be understood that embodiments of the electrostatic support device are particularly well suited for holding thin sheet-like elements, e.g. solar cell elements, particularly photovoltaic panel elements, using electrostatic attractive forces between the thin sheet like elements and the support electrostatic device. For example, the electrostatic support device may beneficially be used for holding and conveying photovoltaic panel elements during production, e.g. during drying or serigraphic processes. More specifically, the electrostatic support device may in particular be beneficial to transport thin sheet-like elements by employing a conveying belt moving in a continuous mode in order to transport thin sheet-like elements between different processing stations. Further, providing a support element including modular flexible panels as described herein allows for easy maintenance and replacement procedures.

Further, according to embodiments which can be combined with any other embodiments described herein, a method for conveying at least one solar cell element in a transport direction is provided. In particular, the method includes providing an electric charge to a support element configured for supporting at least one solar cell element; holding the at least one solar element by an electrostatic force; and moving the at least one solar element in a transport direction.

For example, providing an electric charge to a support element may include employing a support element according to embodiments described herein. Accordingly, holding the at least one solar element by an electrostatic force may include using an electric arrangement as described herein. Accordingly, it is to be understood that the method for conveying at least one solar cell element may be conducted by employing a support device as described herein.

According to embodiments which can be combined with any other embodiments described herein, a support device 900 for conveying at least one solar cell element 910 in a transport direction 911 is provided. The support device includes a support element 920 configured for supporting the at least one solar cell element and an electric arrangement 950 configured for providing an electrostatic force for holding the at least one solar cell element on the support element.

According to embodiments which can be combined with any other embodiments described herein, the electric arrangement 950 includes a charging source 951 configured for providing an electrostatic charge to the support element 920.

According to embodiments which can be combined with any other embodiments described herein, the electric arrangement 950 includes at least one conductive arrangement 960 configured for receiving an electrostatic charge from the charging source 951.

According to embodiments which can be combined with any other embodiments described herein, the at least one conductive arrangement 960 is configured for providing the electrostatic force for holding the at least one solar cell element 910 on the support element 920.

According to embodiments which can be combined with any other embodiments described herein, the at least one conductive arrangement 960 includes a first busbar 961 and/or a second busbar 962.

According to embodiments which can be combined with any other embodiments described herein, the at least one conductive arrangement 960 includes a first electrode arrangement 971 and/or a second electrode arrangement 972.

According to embodiments which can be combined with any other embodiments described herein, the first electrode arrangement 971 and/or the second electrode arrangement 972 are provided within at least one flexible panel 940.

According to embodiments which can be combined with any other embodiments described herein, the flexible panel 940 is releasable attached to the support element 920.

According to embodiments which can be combined with any other embodiments described herein, the flexible panel 940 includes an adhesive portion 941 configured for attaching the flexible panel to the support element 920.

According to embodiments which can be combined with any other embodiments described herein, the support device 900 further includes at least a first roller 901 and a second roller 902 configured for moving the support element 920 in the transport direction 911.

According to embodiments which can be combined with any other embodiments described herein, the electric arrangement 950 includes an electrical grounding for grounding the support element 920.

According to embodiments which can be combined with any other embodiments described herein, the electrical grounding is provided by at least one roller of the first roller 901 and the second roller 902.

According to embodiments which can be combined with any other embodiments described herein, the electrical grounding is provided by a grounding roller 903 configured for grounding the support element.

According to embodiments which can be combined with any other embodiments described herein, the support element is a belt conveyor.

According to embodiments which can be combined with any other embodiments described herein, the support element includes at least one material selected from the group consisting of: polytetrafluoroethylene (PTFE); fiber-reinforced polymer, particularly carbon-fiber-reinforced polymer; fiber-reinforced glass, polyamide and other suitable materials.

According to embodiments which can be combined with any other embodiments described herein, a method for conveying at least one solar cell element 910 in a transport direction 911 is provided. The method includes providing an electric charge to a support element configured for supporting at least one solar cell element; holding the at least one solar element by an electrostatic force; and moving the at least one solar element in a transport direction.

The embodiments of the present disclosure separate, e.g., cleaves a solar cell into smaller pieces, which are then allocated to at least two different solar cell arrangements. As an example, each piece can be allocated to a respective solar cell arrangement based on one or more geometric and/or physical properties of the piece. A solar cell arrangement can thus be made of solar cell elements having similar characteristics and/or quality, and an overall efficiency of the solar cell arrangement can be improved. A module power office solar cell module having the solar cell arrangement can be increased, particularly since the occurrence of "bottlenecks" can be avoided.

While the foregoing is directed to embodiments of the disclosure, other and further embodiments of the disclosure may be devised without departing from the basic scope thereof, and the scope thereof is determined by the claims that follow.

The invention claimed is:

1. Apparatus for manufacture of at least two solar cell arrangements, comprising:
 a separation device configured for separating a first solar cell into two or more first solar cell pieces;
 one or more input conveyors configured for inputting solar cells into the separation device; and
 at least one positioning device;
 a support device including at least two support units, the at least two support units comprising at least a first support unit and a second support unit, wherein the number of the at least two support units is greater than the number of the one or more input conveyors; and
 a controller in communication with the at least one positioning device, the controller programmed to control a movement of the at least one positioning device such that the at least one positioning device positions at least one first solar cell piece of the two or more first solar cell pieces on the support device for forming a first solar cell arrangement of the at least two solar cell arrangements, wherein the first support unit supports the first solar cell arrangement, the controller further programmed to control the movement of the at least one positioning device such that the at least one positioning device positions at least one other first solar cell piece of the two or more first solar cell pieces on the support device for forming a second solar cell arrangement of the at least two solar cell arrangements, and wherein the second support unit supports the second solar cell arrangement.

2. The apparatus of claim 1, wherein the at least one positioning device is configured to arrange a plurality of solar cell pieces including the at least one first solar cell piece on the support device with adjacent solar cell pieces partly overlapping with each other to form the first solar cell arrangement, and is configured to arrange a plurality of other solar cell pieces including the at least one other first solar cell piece on the support device with adjacent solar cell pieces partly overlapping with each other to form the second solar cell arrangement.

3. The apparatus of claim 1, wherein the separation device is configured for separating a second solar cell into two or more second solar cell pieces, wherein the positioning device is configured for positioning at least one second solar cell piece of the one or more second solar cell pieces on the support device for forming the first solar cell arrangement together with the at least one first solar cell piece, and is configured for positioning at least one other second solar cell piece of the two or more second solar cell pieces on the support device for forming the second solar cell arrangement together with the at least one other first solar cell piece.

4. The apparatus of claim 3, wherein the separation device is configured for sequentially or simultaneously separating the first solar cell and the second solar cell into the two or more first solar cell pieces and the two or more second solar cell pieces, respectively.

5. The apparatus of claim 3, wherein the separation device includes a first cleaving device configured for separating the first solar cell into the two or more first solar cell pieces and a second cleaving device configured for separating the second solar cell into the two or more second solar cell pieces.

6. The apparatus of claim 1, wherein the separation device includes at least one solar cell perforation device.

7. The apparatus of claim 6, wherein the at least one solar cell perforation device includes a laser.

8. The apparatus of claim 1, wherein the apparatus is configured to allocate each solar cell piece of the two or more first solar cell pieces to either the first solar cell arrangement or the second solar cell arrangement based on one or more properties of the respective solar cell piece of the two more first solar cell pieces.

9. The apparatus of claim 8, wherein the one or more properties are selected from the group consisting of geometric shape, electrical properties, optical properties, printing quality, and any combination thereof.

10. The apparatus of claim 1, further including at least one of a first inspection device, a second inspection device, and a third inspection device, wherein the first inspection device is configured to measure and/or determine one or more properties of the first solar cell before the solar cell is separated into the two or more first solar cell pieces, wherein the second inspection device is configured to measure and/or determine one or more properties of the two or more first solar cell pieces of the first solar cell after the solar cell has been separated into the two or more first solar cell pieces, and wherein the third inspection device is configured to measure and/or determine one or more properties of the first solar cell arrangement and/or the second solar cell arrangement.

11. The apparatus of claim 1, wherein the support device includes at least one of an electrostatic chuck and a vacuum chuck.

12. The apparatus of claim 1, wherein the support device includes at least a belt conveyor, wherein the at least a belt conveyor is configured to support, fix and transport the first solar cell arrangement and the second solar cell arrangement.

13. The apparatus of claim 12, wherein a movement of the belt conveyor and a movement of the at least one positioning device are synchronized with each other.

14. The apparatus of claim 12, wherein the at least a belt conveyor includes a first belt conveyor configured to support the first solar cell arrangement and a second belt conveyor spaced apart from the first belt conveyor and configured to support the second solar cell arrangement.

15. The apparatus of claim 1, further including a heating device at the support device, wherein the heating device is configured to heat at least one of the first solar cell arrangement and the second solar cell arrangement.

16. The apparatus of claim 1, wherein the at least one positioning device includes vacuum grippers for gripping the two or more first solar cell pieces.

17. System for manufacture of at least two shingled solar cells, comprising:
a separation device configured for separating a first solar cell into two or more first solar cell pieces;
at least one positioning device;
a controller in communication with the at least one positioning device, the controller programmed to control a movement of the at least one positioning device such that the at least one positioning device positions at least one first solar cell piece of the two or more first solar cell pieces on a support device for forming a first solar cell arrangement of the at least two solar cell arrangements, wherein a first support unit supports the first solar cell arrangement, the controller further programmed to control a movement of the at least one positioning device such that the at least one positioning device positions at least one other first solar cell piece of the two or more first solar cell pieces on the support device for forming a second solar cell arrangement of the at least two solar cell arrangements, wherein a second support unit supports the second solar cell arrangement, the positioning device is further controlled by the controller to position the solar cell pieces provided by the separation device on the support device for a parallel assembling of the at least two solar cell arrangements on at least the first support unit and the second support unit; and
a production tool for manufacturing a plurality of solar cells including the first solar cell, wherein the plurality of solar cells are input into the apparatus.

18. The system of claim 17, wherein the production tool includes one or more printing devices configured for printing one or more conductive lines on solar cell substrates used in the manufacture of the plurality of solar cells, wherein the one or more conductive lines are selected from fingers and busbars.

19. The system of claim 18, wherein the one or more printing devices are configured for double printing of at least one of the fingers and busbars.

20. Method for manufacture of at least two solar cell arrangements, comprising:
separating each solar cell of one or more solar cells into two or more solar cell pieces, the two or more solar cell pieces comprising at least a first solar cell piece and a second solar cell piece;
positioning the first solar cell piece on a first support unit and the second solar cell piece on a second support unit;
and assembling at least a first solar cell arrangement and a second solar cell arrangement of the at least two solar cell arrangements from the two or more solar cell pieces, wherein the first solar cell arrangement and the second solar cell arrangement are assembled in parallel on the first support unit and the second support unit, respectively, wherein the first solar cell arrangement includes the first solar cell piece and the second solar cell arrangement includes the second solar cell piece, and wherein each solar cell piece of the two or more solar cell pieces is allocated to the first solar cell arrangement or the second solar cell arrangement based on one or more geometric and/or physical properties of the solar cell piece.

21. The method of claim 20, wherein the one or more geometric and/or physical properties are selected from the group consisting of geometric shape, electrical properties, optical properties, and any combination thereof.

22. The method of claim 20, further including:
determining the one or more geometric and/or physical properties before the separating of each solar cell and after the forming of the first solar cell arrangement and the second solar cell arrangement.

23. The method of claim 20, wherein each solar cell of the one or more solar cells is separated into two, three, four, five, six, or more solar cell pieces.

24. The method of claim 20, wherein the one or more solar cells are selected from the group consisting of full-square solar cells and pseudo-square solar cells.

25. The method of claim 20, further including:
gripping the two or more solar cell pieces; and
positioning the two or more solar cell pieces on a support device to form the first solar cell arrangement and the second solar cell arrangement.

26. The method of claim 25, further including:
applying an adhesive to the two or more solar cell pieces before positioning the two or more solar cell pieces on the support device.

27. The method of claim 26, further including:
drying the adhesive while the two or more solar cell pieces are fixed to the support device.

* * * * *